(12) United States Patent
Lee et al.

(10) Patent No.: US 12,029,029 B2
(45) Date of Patent: Jul. 2, 2024

(54) SEMICONDUCTOR MEMORY DEVICES

(71) Applicant: Samsung Electronics Co., Ltd., Suwon-si (KR)

(72) Inventors: Kyunghwan Lee, Seoul (KR); Yongseok Kim, Suwon-si (KR); Hyuncheol Kim, Seoul (KR); Dongsoo Woo, Seoul (KR); Sungwon Yoo, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 175 days.

(21) Appl. No.: 17/716,215

(22) Filed: Apr. 8, 2022

(65) Prior Publication Data

US 2022/0367479 A1 Nov. 17, 2022

(30) Foreign Application Priority Data

May 11, 2021 (KR) ........................ 10-2021-0060737

(51) Int. Cl.
*H10B 12/00* (2023.01)
*H01L 29/423* (2006.01)
*H01L 29/792* (2006.01)

(52) U.S. Cl.
CPC ......... *H10B 12/50* (2023.02); *H01L 29/4234* (2013.01); *H01L 29/7926* (2013.01)

(58) Field of Classification Search
CPC .. H10B 12/50; H01L 29/4234; H01L 29/7926
See application file for complete search history.

(56) References Cited

U.S. PATENT DOCUMENTS 8,134,202 B2 3/2012 Tak et al.
8,329,535 B2 12/2012 Wu
(Continued)

FOREIGN PATENT DOCUMENTS

KR 10-1073643 B1 8/2010
KR 10-1085155 B1 10/2010
(Continued)

OTHER PUBLICATIONS

C. Zhao et al. 'Review on Non-Volatile Memory with High-k Dielectrics: Flash for Generation Beyond 32 nm' *Materials*, 2014, 7, pp. 5117-5145.
(Continued)

*Primary Examiner* — Mohammad M Choudhry
(74) *Attorney, Agent, or Firm* — HARNESS, DICKEY & PIERCE, P.L.C.

(57) ABSTRACT

A semiconductor memory device includes a semiconductor substrate a gate structure extending in a vertical direction on the semiconductor device, a plurality of charge trap layers spaced apart from each other in the vertical direction and each having a horizontal cross-section with a first ring shape surrounding the gate structure, a plurality of semiconductor patterns spaced apart from each other in the vertical direction and each having a horizontal cross-section with a second ring shape surrounding the plurality of charge trap layers, a source region and a source line at one end of each of the plurality of semiconductor patterns in a horizontal direction, and a drain region and a drain line at an other end of each of the plurality of semiconductor patterns in the horizontal direction. The gate structure may include a gate insulation layer and a gate electrode layer.

20 Claims, 40 Drawing Sheets

(56) References Cited

U.S. PATENT DOCUMENTS

| | | | |
|---|---|---|---|
| 8,426,906 | B2 | 4/2013 | Wu |
| 8,947,932 | B2 | 2/2015 | Lee |
| 9,478,550 | B2 | 10/2016 | Karda et al. |
| 9,508,854 | B2 | 11/2016 | Biswas et al. |
| 10,734,513 | B2 | 8/2020 | Majhi et al. |
| 2009/0021979 | A1 | 1/2009 | Sung et al. |
| 2012/0280304 | A1* | 11/2012 | Lee .................... H01L 29/7926 |
| | | | 257/E21.422 |
| 2015/0037949 | A1 | 2/2015 | Lee |
| 2020/0411540 | A1 | 12/2020 | Cheon et al. |
| 2021/0066299 | A1 | 3/2021 | Cho |

FOREIGN PATENT DOCUMENTS

| | | |
|---|---|---|
| KR | 10-1965798 B1 | 11/2018 |
| KR | 10-2202910 B1 | 9/2019 |
| TW | 201419538 A | 5/2014 |

OTHER PUBLICATIONS

G. Zhang et al. 'Spatial Distribution of Charge Traps in a SONOS-Type Flash Memory Using a High-k Trapping Layer' *IEEE Transactions on Electron Devices*, vol. 54, No. 12, 2007, pp. 3317-3324.
Office Action dated Jul. 10, 2023, issued in corresponding Taiwanese Patent Application No. 111115942.

\* cited by examiner

SEMICONDUCTOR MEMORY DEVICES

CROSS-REFERENCE TO RELATED APPLICATION

This application is based on and claims priority under 35 U.S.C. § 119 to Korean Patent Application No. 10-2021-0060737, filed on May 11, 2021 in the Korean Intellectual Property Office, the disclosure of which is incorporated by reference herein in its entirety.

BACKGROUND

Inventive concepts relate to semiconductor memory devices, and more particularly, to capacitorless semiconductor memory devices.

According to the demand for miniaturization, multifunction, and high performance of electronic products, a high-capacity semiconductor memory device may be required. Furthermore, an increased degree of integration to provide such high capacity semiconductor memory device may be required. Accordingly, a high degree of integration and large capacity in a semiconductor memory device may be required. Among such semiconductor memory devices, dynamic random access memory (DRAM) generally includes a capacitor; however, due to memory functions, it may be difficult to reduce the capacity of the capacitor, which may limit high integration.

SUMMARY

Inventive concepts provide a capacitorless semiconductor memory device capable of high performance and high integration.

Additional aspects will be set forth in part in the description that follows and, in part, will be apparent from the description, or may be learned by practice of the presented embodiments of the disclosure.

According to an embodiment of inventive concepts, a semiconductor memory device may include a semiconductor substrate, a gate structure extending in a vertical direction on the semiconductor device, a plurality of charge trap layers each having a horizontal cross-section with a first ring shape surrounding the gate structure, a plurality of semiconductor patterns each having a horizontal cross-section with a second ring shape surrounding the plurality of charge trap layers, a source region and a source line at one end of each of the plurality of semiconductor patterns in a horizontal direction, and a drain region and a drain line at an other end of each of the plurality of semiconductor patterns in the horizontal direction. The gate structure may include a gate insulation layer and a gate electrode layer. The plurality of charge trap layers may be spaced apart from each other in the vertical direction. The plurality of semiconductor patterns may be spaced apart from each other in the vertical direction. The source region may be doped with a first conductivity type impurity. The drain region may be doped with a second conductivity type impurity. The second conductivity type impurity may be opposite the first conductivity type impurity.

According to an embodiment of inventive concepts, a semiconductor memory device may include a semiconductor substrate, a gate structure extending in a vertical direction on the semiconductor substrate, a plurality of charge trap layers each having a horizontal cross-section with a first ring shape surrounding the gate structure, a plurality of semiconductor patterns each having a horizontal cross-section with a second ring shape surrounding the plurality of charge trap layers, a source line extending in the vertical direction on the semiconductor substrate, a source region between one end of each of the plurality of semiconductor patterns and the source line, a drain region and a drain line at an other end of each of the plurality of semiconductor patterns in a horizontal direction. The gate structure may include a gate insulation layer and a gate electrode layer. The plurality of charge trap layers may be spaced apart from each other in the vertical direction. The plurality of semiconductor patterns may be spaced apart from each other in the vertical direction. The source region may be doped with a first conductivity type impurity. The drain region may be doped with a second conductivity type impurity. The second conductivity type impurity may be opposite the first conductivity type impurity.

According to an embodiment of inventive concepts, a capacitorless semiconductor memory device may include a semiconductor substrate, an etch stop layer on the semiconductor substrate, a plurality of mold insulation layers and a plurality of sacrificial insulation layers alternately stacked on the etch stop layer; a gate structure having a horizontal cross-section with a circle shape, a plurality of charge trap layers each having a horizontal cross-section with a first ring shape surrounding the gate structure, a plurality of channel regions each having a horizontal cross-section with a second ring shape surrounding the plurality of charge trap layers, a source region at one end of each of the plurality of channel regions and a source line electrically connected to the source region, and a drain region at an other end of each of the plurality of channel regions and a drain line electrically connected to the drain region. The gate structure may extend into the etch stop layer by penetrating the plurality of mold insulation layers and the plurality of sacrificial insulation layers in a vertical direction. The gate structure may include a gate insulation layer and a gate electrode layer. The plurality of charge trap layers may be spaced apart from each other in the vertical direction. The plurality of channel regions may be spaced apart from each other in the vertical direction. The source region may be doped with a first conductivity type impurity. The drain region may be doped with a second conductivity type impurity. The second conductivity type may be opposite the first conductivity type impurity.

BRIEF DESCRIPTION OF THE DRAWINGS

Embodiments of inventive concepts will be more clearly understood from the following detailed description taken in conjunction with the accompanying drawings in which:

FIGS. 4A to 11A are plane views illustrating in the order of process a method of manufacturing a semiconductor memory device according to an embodiment of inventive concepts, and FIGS. 4B to 11B are cross-sectional views taken along the line B-B' of FIGS. 4A to 11A, respectively; and FIGS. 12A to 20A are plane views illustrating in the order of process a method of manufacturing a semiconductor memory device according to another embodiment of inventive concepts, and FIGS. 12B to 20B are cross-sectional views taken along the line B-B' of FIGS. 12A to 20A, respectively.

DETAILED DESCRIPTION OF THE EMBODIMENTS

Hereinafter, embodiments of inventive concepts will be described in detail with reference to the accompanying drawings.

Figure 1A:
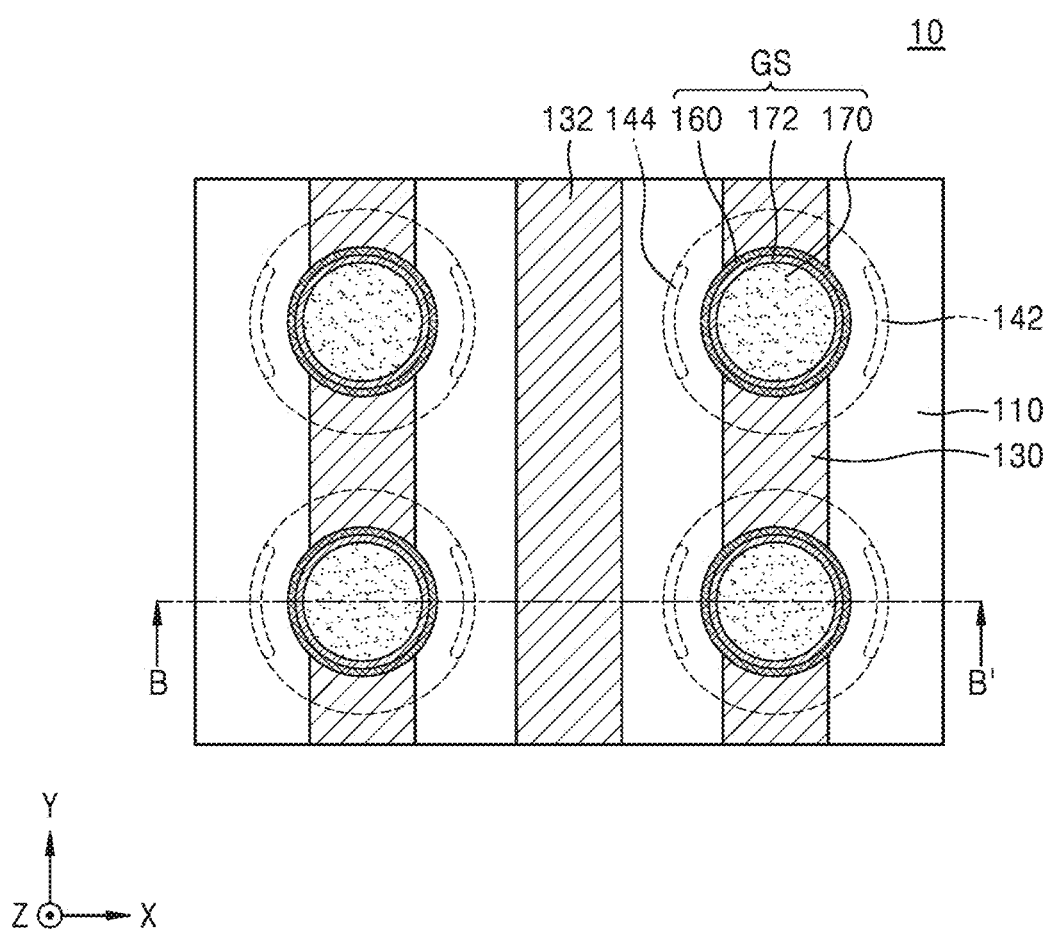
FIG. 1A is a plane view of a semiconductor memory device according to an embodiment of inventive concepts.
Figure 1B:
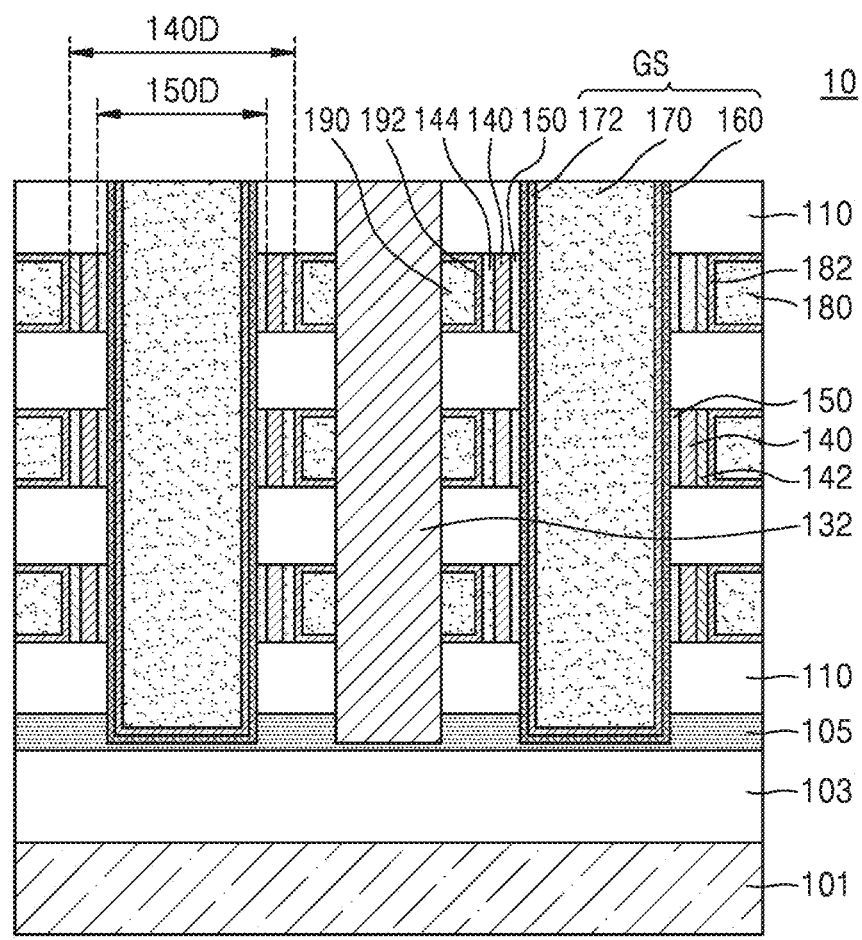
FIG. 1B is a cross-sectional view taken along the line B-B' of FIG. 1A.

FIG. 1A is a plane view of a semiconductor memory device according to an embodiment of inventive concepts, and FIG. 1B is a cross-sectional view taken along the line B-B' of FIG. 1A.

With reference to FIGS. 1A and 1B, a semiconductor memory device 10 may include a semiconductor substrate 101, a gate structure GS, a charge trap layer 150, a semiconductor pattern 140, a source region 142, a source line 180, a drain region 144, and a drain line 190.

The semiconductor substrate 101 may include, for example, silicon (Si). Alternatively, the semiconductor substrate 101 may include an elemental semiconductor, such as germanium (Ge), or a compound semiconductor, such as silicon carbide (SiC), gallium arsenide (GaAs), indium arsenide (InAs), and indium phosphide (InP). Alternatively, the semiconductor substrate 101 may have a silicon-on-insulator (SOI) structure. For example, the semiconductor substrate 101 may include a buried oxide (BOX) layer.

A base insulation layer 103 may be formed on the semiconductor substrate 101. The base insulation layer 103 may include, for example, a material including at least one of a silicon oxide, a silicon nitride, and a silicon oxynitride. The base insulation layer 103 may include a single-layer consisting of one type of insulation layer, a double-layer consisting of two types of insulation layers, or a multi-layer consisting of at least three types of insulation layers.

An etch stop layer 105 may be formed on the base insulation layer 103. The top surface of the etch stop layer 105 may be an uneven surface, and the bottom surface of the etch stop layer 105 may be a flat surface. The etch stop layer 105 may include, for example, a silicon nitride or a silicon oxide.

A plurality of mold insulation layers 110 may be arranged spaced apart from each other by a certain distance in the vertical direction (the Z direction) on the etch stop layer 105. The plurality of mold insulation layers 110 may include at least one of a silicon oxide, a silicon nitride, and a silicon oxynitride. In some embodiments, the plurality of mold insulation layers 110 and the etch stop layer 105 may respectively include materials having etch selectivity with respect to each other. For example, when the mold insulation layer 110 includes a silicon oxide, the etch stop layer 105 may include a silicon nitride.

A first buried insulation layer 130 and a second buried insulation layer 132 may penetrate the plurality of mold insulation layers 110. The first buried insulation layer 130 and the second buried insulation layer 132 may be arranged between the plurality of gate structures GS. For example, the etch stop layer 105 may be arranged at the bottom of the first buried insulation layer 130 and the second buried insulation layer 132. In some embodiments, the first buried insulation layer 130 and the second buried insulation layer 132 may be spaced apart from each other in a first horizontal direction (the X direction), and extend in a second horizontal direction (the Y direction). In some embodiments, the first buried insulation layer 130 may be arranged to be in contact with the plurality of gate structures GS, and the second buried insulation layer 132 may be arranged to be spaced apart from the plurality of gate structures GS. The first buried insulation layer 130 and the second buried insulation layer 132 may include, for example, a silicon oxide, a silicon nitride, or combinations thereof.

The plurality of gate structures GS may be arranged spaced apart from each other on the semiconductor substrate 101 in the first horizontal direction (the X direction) and the second horizontal direction (the Y direction), and extend in the vertical direction (the Z direction). The plurality of gate structures GS may be arranged in a vertical opening penetrating the plurality of mold insulation layers 110. In some embodiments, unlike the description of the drawings, the width in the horizontal directions (the X direction and the Y direction) of each of the plurality of gate structures GS may taper off toward the semiconductor substrate 101.

The plurality of gate structures GS may include a gate insulation layer 160 arranged on an inner wall of the vertical opening, and a gate electrode layer 170 filling the inside of the vertical opening on the gate insulation layer 160. The drawings illustrate that the plurality of gate structures GS have a circle-shaped horizontal cross-section, but inventive concepts are not limited thereto.

The gate insulation layer 160 may include, for example, a silicon oxide. The gate insulation layer 160 may include a material having a relatively low trap site density, compared to the charge trap layer 150.

In some embodiments, a gate barrier layer 172 may be formed between the gate insulation layer 160 and the gate electrode layer 170. For example, the gate electrode layer 170 and the gate barrier layer 172 may include at least one of a doped semiconductor material (e.g., doped silicon, doped germanium, etc.), a conductive metallic nitride (e.g., a titanium nitride, a tantalum nitride, etc.), a metal (e.g., tungsten, titanium, tantalum, etc.), and a metal-semiconductor compound (e.g., tungsten silicide, cobalt silicide, titanium silicide, etc.)

The charge trap layers 150 may be arranged spaced apart from each other on a side wall of each of the plurality of gate structures GS in the vertical direction (the Z direction). The charge trap layer 150 may have a ring-shaped horizontal cross-section surrounding the side wall of the plurality of gate structures GS. The plurality of charge trap layers 150 and the plurality of mold insulation layers 110 may be arranged alternately on the side wall of the gate structures GS. That is, the mold insulation layers 110 may surround parts of the side wall of the gate structures GS, where the charge trap layers 150 do not cover.

The charge trap layer 150 may include a high-k dielectric material having a relatively high permittivity, compared to the gate insulation layer 160. Further, the charge trap layer 150 may include a material having a relatively high trap site density, compared to the gate insulation layer 160. For example, the charge trap layer 150 may include at least one selected from $HfO_2$, $Al_2O_3$, $ZrO_2$, $Y_2O_3$, HfSON, HfON, and HfAlO, or a silicon nitride. In some embodiments, the charge trap layer 150 may be a dielectric layer doped with a transition metal. For example, the charge trap layer 150 may include $HfO_2$ doped with a transition metal, such as Ta, V, Ru, Nb, Mn, Pd, Ir, Sb, etc., or $Al_2O_3$ doped with a transition metal, such as Zn, W, Mo, Ru, Si, Hf, Ni, Pt, etc.

The semiconductor patterns 140 may be arranged to be spaced apart from each other in the vertical direction (the Z direction) and to cover the charge trap layer 150. The semiconductor pattern 140 may have a ring-shaped horizontal cross-section surrounding the charge trap layer 150. The diameter 140D of the semiconductor pattern 140 may be greater than the diameter 150D of the charge trap layer 150.

The semiconductor pattern 140 may include an undoped semiconductor material or a doped semiconductor material. In some embodiments, the semiconductor pattern 140 may include intrinsic polysilicon or doped polysilicon. In some embodiments, the semiconductor pattern 140 may include an amorphous metallic oxide, a polycrystal metallic oxide, combinations thereof, etc. For example, the semiconductor pattern 140 may include at least one of an In—Ga based oxide (IGO), an In—Zn based oxide (IZO), and an In—Ga—Zn based oxide (IGZO). In other embodiments, the semiconductor pattern 140 may include a 2D material semiconductor, and the 2D material semiconductor may include, for example, $MoS_2$, $WSe_2$, graphene, carbon nanotube, or combinations thereof.

A plurality of source lines 180 and a plurality of drain lines 190 may be arranged to face each other on either side of the semiconductor pattern 140.

The plurality of source lines 180 may extend adjacent to one end of the plurality of semiconductor patterns 140 in the first horizontal direction (the X direction), and be arranged spaced apart from each other in the vertical direction (the Z direction). The mold insulation layer 110 may be arranged between two source lines 180 adjacent in the vertical direction (the Z direction). The plurality of source lines 180 may include any one of a doped semiconductor material, a conductive metallic nitride, a metal, and a metal-semiconductor compound.

The source region 142 may be arranged between the plurality of source lines 180 and the plurality of semiconductor patterns 140 connected thereto. The source region 142 may include a semiconductor material doped with the first conductivity type impurity at a high concentration level. Here, the first conductivity type may be n type, and for example, the source region 142 may be an n+ region doped with an n type impurity at a high concentration level.

In some embodiments, a source barrier layer 182 may be arranged in a side opening which extends in the first horizontal direction (the X direction) by penetrating the plurality of mold insulation layers 110. The source barrier layer 182 may be in contact with the mold insulation layer 110 and the source region 142, and the inside of the source barrier layer 182 may be filled with the source line 180.

The plurality of drain lines 190 may extend adjacent to another end of the plurality of semiconductor patterns 140 in the first horizontal direction (the X direction), and be arranged spaced apart from each other in the vertical direction (the Z direction). The mold insulation layer 110 may be arranged between two drain lines 190 adjacent in the vertical direction (the Z direction). The plurality of drain lines 190 may include any one of a doped semiconductor material, a conductive metallic nitride, a metal, and a metal-semiconductor compound.

The drain region 144 may be arranged between the plurality of drain lines 190 and the plurality of semiconductor patterns 140 connected thereto. The drain region 144 may include a semiconductor material doped with the second conductivity type impurity, which is opposite to the first conductivity type impurity, at a high concentration level. Here, the second conductivity type may be p type, and for example, the drain region 144 may be a p+ region doped with a p type impurity at a high concentration level. That is, in the semiconductor memory device 10 of inventive concepts, the source region 142 may have a conductivity type opposite to that of the drain region 144.

In some embodiments, a drain barrier layer 192 may be arranged in a side opening which extends in the first horizontal direction (the X direction) by penetrating the plurality of mold insulation layers 110. The drain barrier layer 192 may be in contact with the mold insulation layer 110 and the drain region 144, and the inside of the drain barrier layer 192 may be filled with the drain line 190.

In some embodiments, although it is not shown in the drawings, a selection transistor may be arranged around a memory cell transistor.

In the semiconductor memory device 10, the semiconductor pattern 140 may operate as a channel region of a memory cell. At a part of the charge trap layer 150 adjacent to the source region 142, a plurality of carriers (e.g., electrons) which are in the source region 142 may be trapped. Also, at another part of the charge trap layer 150 adjacent to the drain region 144, a plurality of carriers (e.g., holes) which are in the drain region 144 may be trapped. Accordingly, by the plurality of carriers trapped in the charge trap layer 150, the semiconductor memory device 10 may operate in a manner similar to how a tunnel field effect transistor (TFET) storing data in a memory cell operates. That is, the semiconductor memory device 10 may function as dynamic random access memory (DRAM) capable of performing a read/write operation for stored 1-bit data without using a capacitor. In this manner, a capacitorless semiconductor memory device may be implemented.

As for a driving method of such semiconductor memory device using a TFET, the semiconductor memory device uses a tunneling method to control the flow of electrons and holes, which is different than the method of thermionic emission used by a metal-oxide semiconductor field-effect transistor (MOSFET), and accordingly, a minor change in an input voltage may lead to a significant change in an output current. Only, in a general TFET, both of a source region and a drain region include the same n type impurity, which leads to relatively long hole accumulation time, and further to a slow erase operation.

Accordingly, to solve such an issue, the inventors of the semiconductor memory device 10 according to embodiments of inventive concepts in the present application have designed the semiconductor memory device 10 to allow the holes to be directly provided from the drain region 144 doped with a p type impurity at a high concentration level in an erase operation. Accordingly, the hole accumulation time of the semiconductor memory device 10 is relatively short, which may lead to a significant increase in the erase speed.

Ultimately, as the semiconductor memory device 10 according to embodiments of inventive concepts may increase the erase speed significantly while having the characteristics of high integration and high scalability through a memory cell structure, high performance can be achieved, which may result in excellent competitiveness and reliability.

Figure 2A:
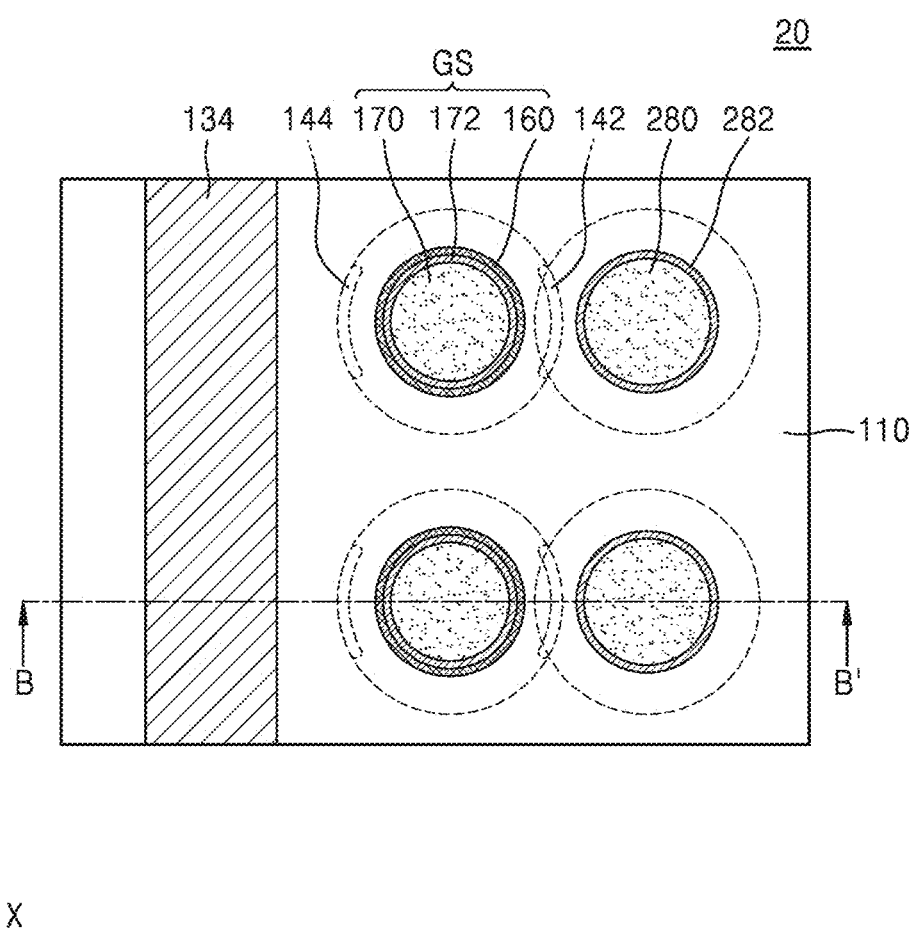
FIG. 2A is a plane view of a semiconductor memory device according to another embodiment of inventive concepts.
Figure 2B:
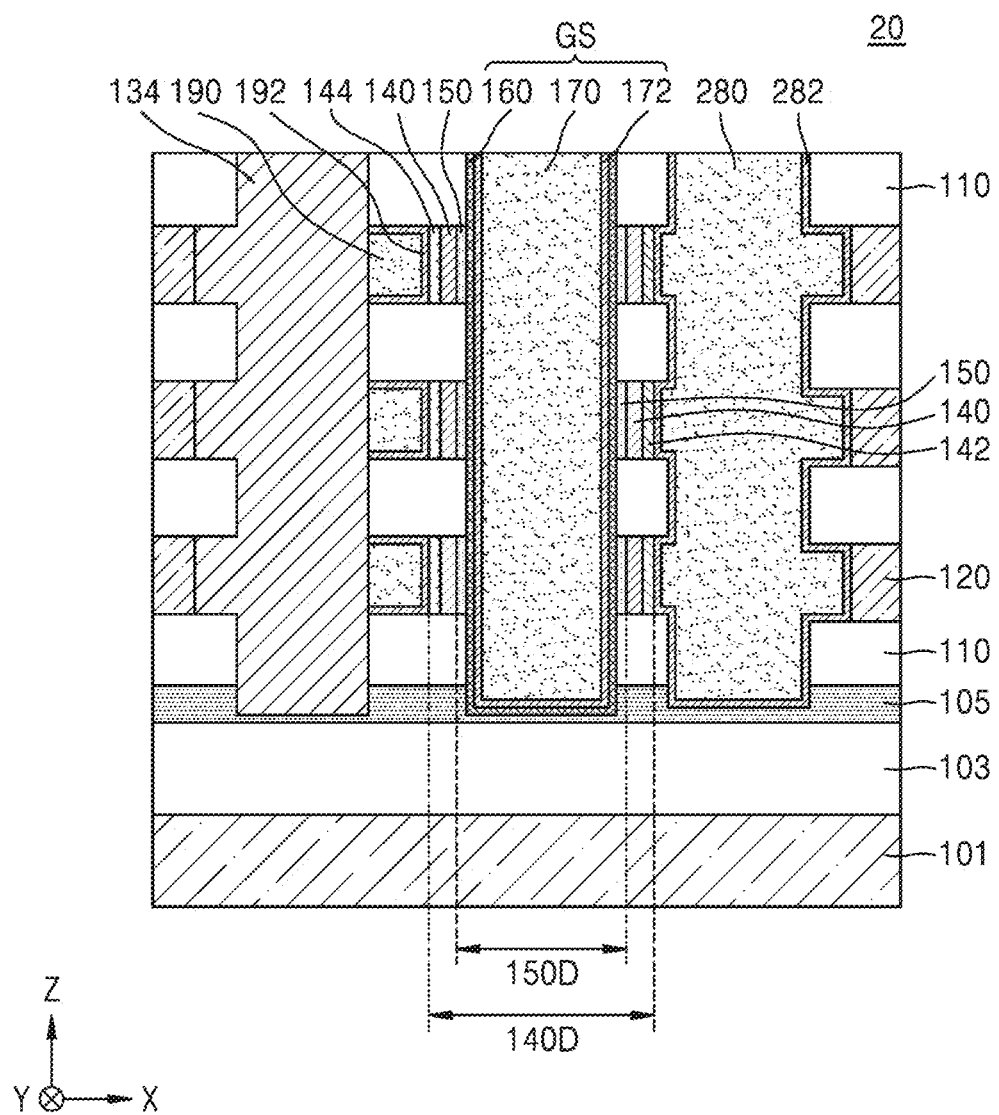
FIG. 2B is a cross-sectional view taken along the line B-B' of FIG. 2A.

FIG. 2A is a plane view of a semiconductor memory device according to another embodiment of inventive concepts, and FIG. 2B is a cross-sectional view taken along the line B-B' of FIG. 2A.

Most of the components constituting a semiconductor memory device 20 and the materials included in the components described below may be substantially identical or similar to the components and materials described above with reference to FIGS. 1A and 1B. Accordingly, for convenience in explanation, descriptions thereon will focus on the differences from the semiconductor memory device 10 described above.

With reference to FIGS. 2A and 2B, the semiconductor memory device 20 may include the semiconductor substrate 101, the gate structure GS, the charge trap layer 150, the semiconductor pattern 140, the source region 142, a source line 280, the drain region 144, and the drain line 190.

A plurality of mold insulation layers 110 and a plurality of sacrificial insulation layers 120 may be arranged alternately on the etch stop layer 105 in the vertical direction (the Z direction). The plurality of mold insulation layers 110 and the plurality of sacrificial insulation layers 120 may include at least one of a silicon oxide, a silicon nitride, and a silicon oxynitride. In some embodiments, the mold insulation layer 110 and the sacrificial insulation layer 120 may respectively include materials having etch selectivity with respect to each other. For example, when the mold insulation layer 110 includes a silicon oxide, the sacrificial insulation layer 120 may include a silicon nitride.

A buried insulation layer 134 may penetrate the plurality of mold insulation layers 110 and the plurality of sacrificial insulation layers 120. The buried insulation layer 134 may be arranged spaced apart from the plurality of gate structures GS. The etch stop layer 105 may be arranged at the bottom surface of the buried insulation layer 134. In some embodiment, the buried insulation layer 134 may extend in the second horizontal direction (the Y direction). The buried insulation layer 134 may include, for example, a silicon oxide, a silicon nitride, or combinations thereof.

The plurality of source lines 280 and the plurality of drain lines 190 may be arranged on either side of the semiconductor pattern 140.

The plurality of source lines 280 may extend in the vertical direction (the Z direction) by penetrating the plurality of mold insulation layers 110 and the plurality of sacrificial insulation layers 120, and have an uneven surface protruding in the first horizontal direction (the X direction) to be in contact with one end of the plurality of semiconductor patterns 140. The plurality of source lines 280 may include any one of a doped semiconductor material, a conductive metallic nitride, and a metal-semiconductor compound.

The source region 142 may be arranged between one source line 280 and the plurality of semiconductor patterns 140 connected thereto. The source region 142 may include a semiconductor material doped with the first conductivity type impurity at a high concentration level. Here, the first conductivity type may be n type, and for example, the source region 142 may be an n+ region doped with an n type impurity at a high concentration level.

In some embodiments, a source barrier layer 282 may be arranged on an inner wall of a vertical opening which extends in the vertical direction (the Z direction) by penetrating the plurality of mold insulation layers 110 and the plurality of sacrificial insulation layers 120. The source barrier layer 282 may be in contact with the mold insulation layer 110, the sacrificial layer 120, and the source region 142, and the inside of the source barrier layer 282 may be filled with the source line 280.

The plurality of drain lines 190 may extend adjacent to another end of the plurality of semiconductor patterns 140 in the first horizontal direction (the X direction), and be arranged spaced apart from each other in the vertical direction (the Z direction). The mold insulation layer 110 may be arranged between two drain lines 190 adjacent in the vertical direction (the Z direction). The plurality of drain lines 190 may include a doped semiconductor material, a conductive metallic nitride, a metal, and a metal-semiconductor compound.

The drain region 144 may be arranged between the plurality of drain lines 190 and the plurality of semiconductor patterns 140 connected thereto. The drain region 144 may include a semiconductor material doped with the second conductivity type impurity, which is opposite to the first conductivity type impurity, at a high concentration level. Here, the second conductivity type may be p type, and for example, the drain region 144 may be a p+ region doped with a p type impurity at a high concentration level. That is, in the semiconductor memory device 20 of inventive concepts, the source region 142 may have a conductivity type opposite to that of the drain region 144.

In some embodiments, although it is not shown in the drawings, the plurality of source lines 280 may operate as a common source line (CSL).

The semiconductor memory device 20 according to embodiments of inventive concepts have designed the semiconductor memory device 20 to allow the holes to be directly provided from the drain region 144 doped with a p type impurity at a high concentration level in an erase operation. Accordingly, the hole accumulation time of the semiconductor memory device 20 is relatively short, which may lead to a significant increase in the erase speed.

Ultimately, as the semiconductor memory device 20 according to embodiments of inventive concepts may increase the erase speed significantly while having the characteristics of high integration and high scalability through a memory cell structure, high performance can be achieved, which may result in excellent competitiveness and reliability.

Figure 3A:
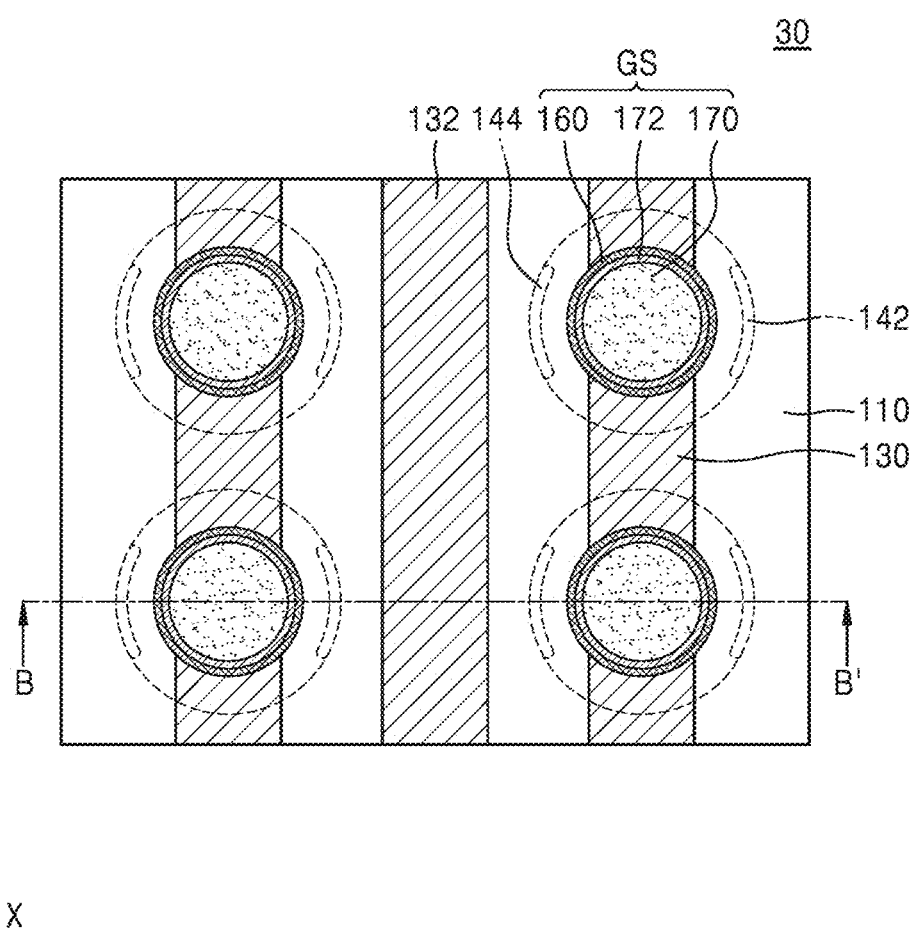
FIG. 3A is a plane view of a semiconductor memory device according to another embodiment of inventive concepts.
Figure 3B:
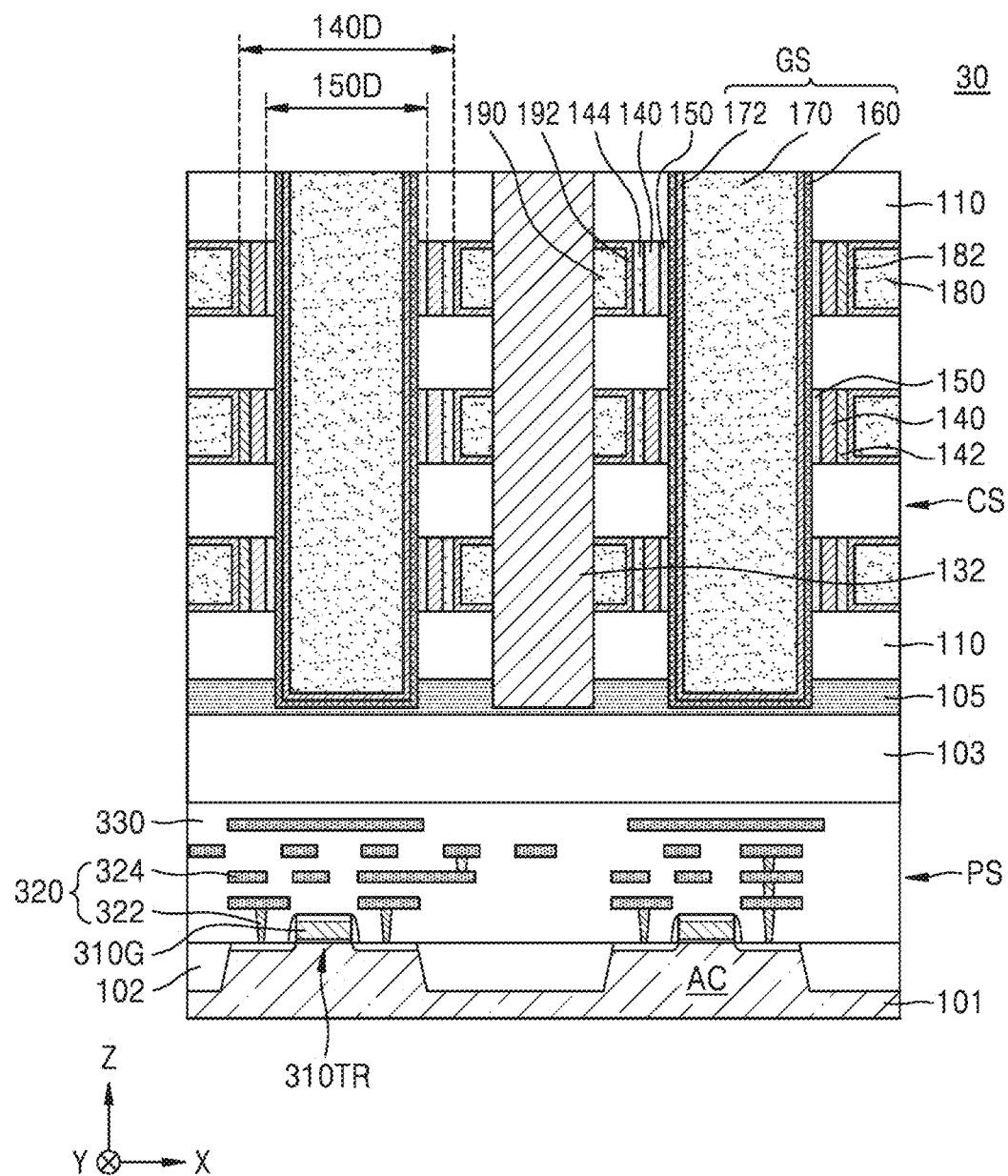
FIG. 3B is a cross-sectional view taken along the line B-B' of FIG. 3A.

FIG. 3A is a plane view of a semiconductor memory device according to another embodiment of inventive concepts, and FIG. 3B is a cross-sectional view taken along the line B-B' of FIG. 3A.

Most of the components constituting a semiconductor memory device 30 and the materials included in the components described below may be substantially identical or similar to components and materials described above with reference to FIGS. 1A and 1B. Accordingly, for convenience in explanation, descriptions thereon will focus on the differences from the semiconductor memory device 10 described above.

With reference to FIGS. 3A and 3B, the semiconductor memory device 30 may include a peripheral circuit structure PS, and a cell array structure CS arranged at a higher vertical level than the peripheral circuit structure PS.

The semiconductor memory device 30 of the embodiment may have a cell-on-periphery (COP) structure in which the cell array structure CS is arranged on the peripheral circuit structure PS. The base insulation layer 103 may be arranged between the peripheral circuit structure PS and the cell array structure CS.

The peripheral circuit structure PS may include a peripheral circuit transistor 310TR and a peripheral circuit wiring 320, arranged on the semiconductor substrate 101. In the semiconductor substrate 101, an active region AC may be defined by a device separator 102, and the plurality of peripheral circuit transistors 310TR may be formed on the active region AC. The plurality of peripheral circuit transistors 310TR may include a peripheral circuit gate 310G as well as a source region and a drain region, arranged on parts of the semiconductor substrate 101 at either side of the peripheral circuit gate 310G.

The peripheral circuit wiring 320 may include a plurality of peripheral circuit contacts 322 and a plurality of peripheral circuit metal layers 324. An interlayer insulation film 330 covering the peripheral circuit transistor 310TR and the peripheral circuit wiring 320 may be arranged on the semiconductor substrate 101. The plurality of peripheral circuit metal layers 324 may have a multi-layer structure including a plurality of metal wiring layers arranged at different vertical levels. The drawings illustrate the plurality of peripheral circuit metal layers 324 as having the same thickness; however, unlike the descriptions in the drawings, peripheral circuit metal layers 324 arranged at some levels (e.g., at the highest level) may have a greater thickness than peripheral circuit metal layers 324 arranged at the rest of the levels.

Figure 4A:
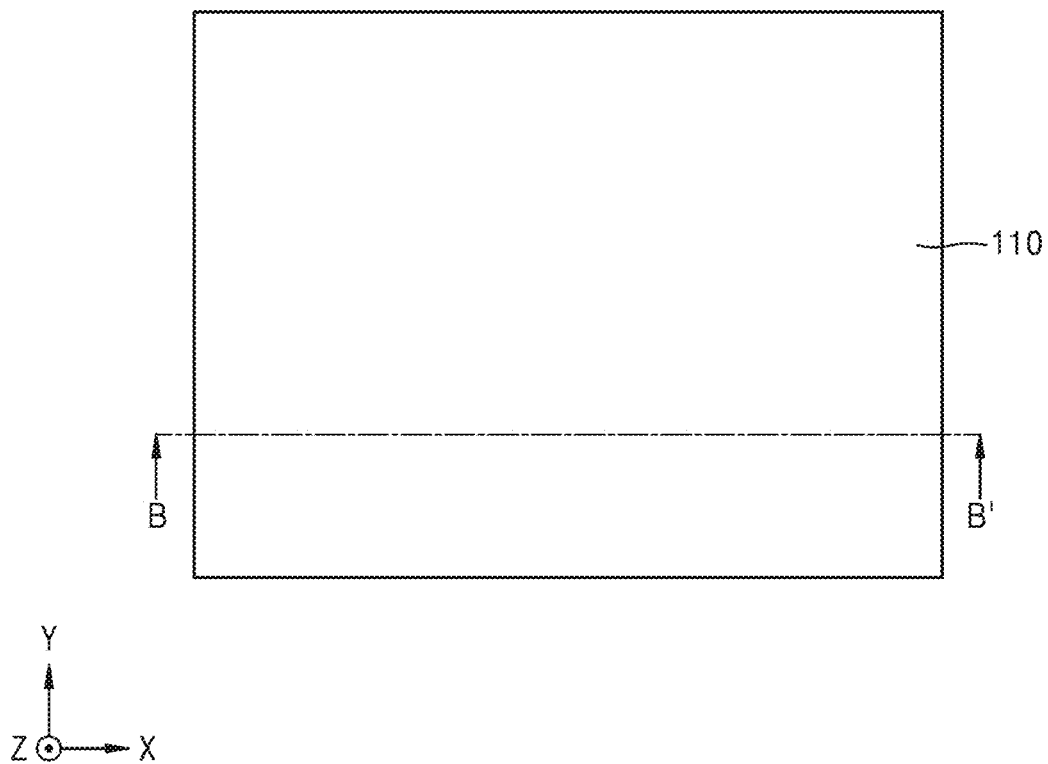
Figure 4B:
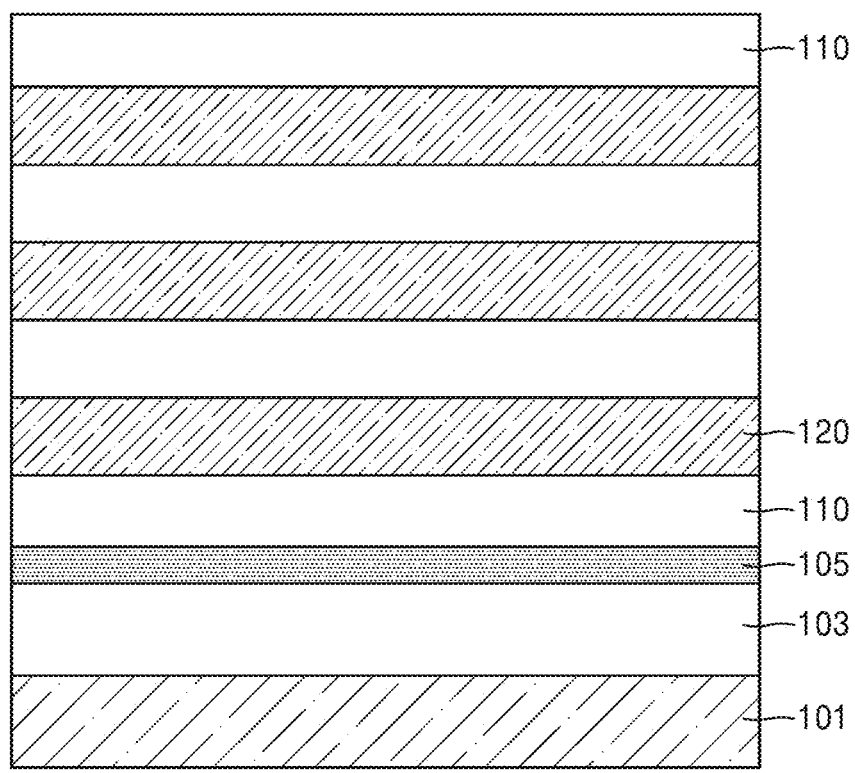
Figure 5A:
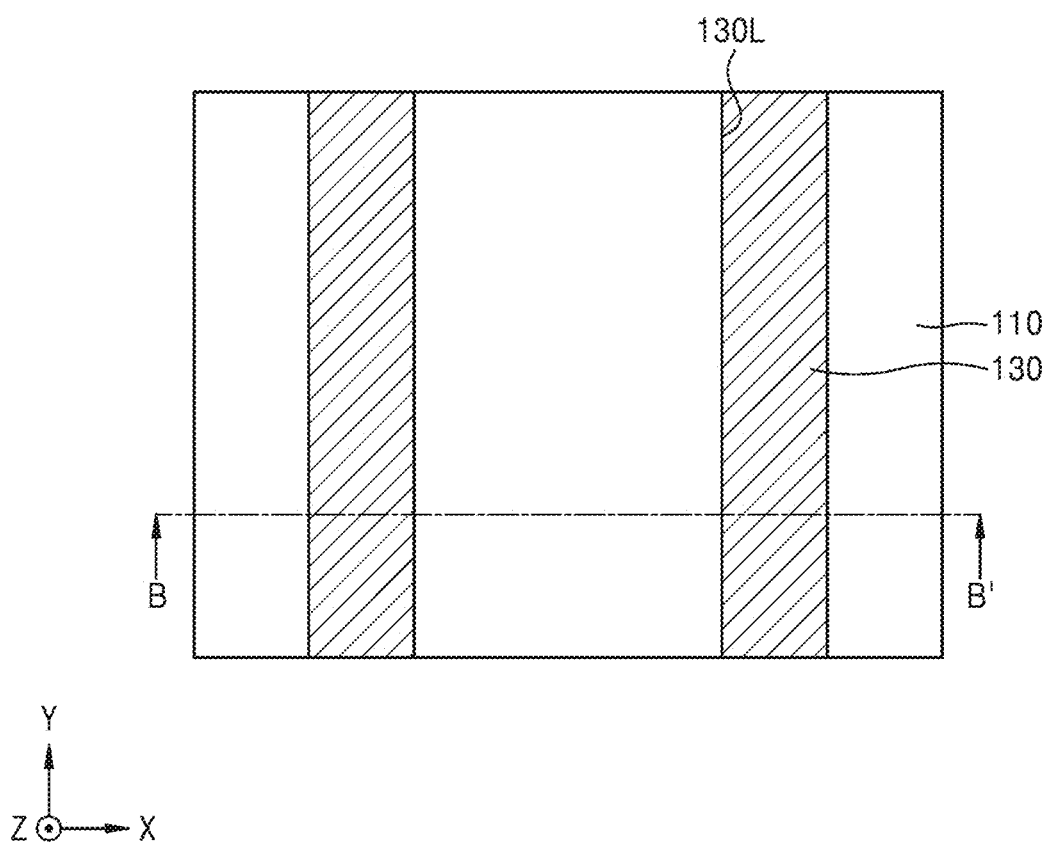
Figure 5B:
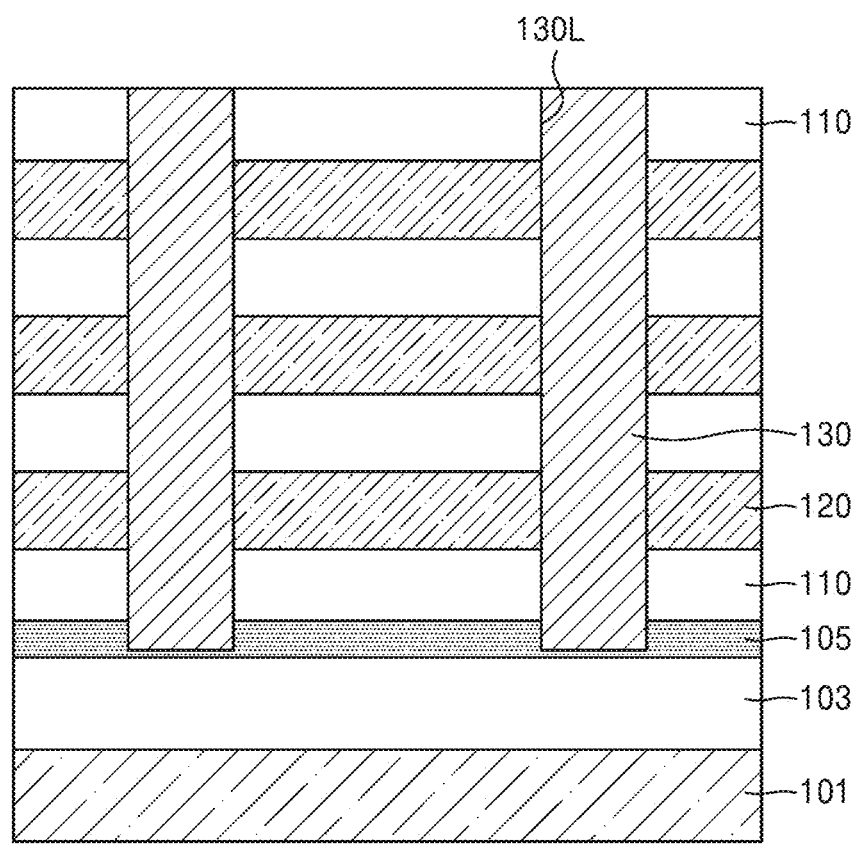

FIGS. 4A, 5A, . . . and 11A are plane views illustrating in the order of process a method of manufacturing a semiconductor memory device according to an embodiment of inventive concepts, and FIGS. 4B, 5B, . . . and 11B are cross-sectional views taken along the line B-B' of FIGS. 4A, 5A, . . . 11A, respectively.

With reference to FIGS. 4A and 4B, the base insulation layer 103 and the etch stop layer 105 may be formed on the semiconductor substrate 101. The plurality of mold insulation layers 110 and the plurality of sacrificial insulation layers 120 may be formed alternately and sequentially on the etch stop layer 105.

The plurality of mold insulation layers 110 and the plurality of sacrificial insulation layers 120 may be formed by chemical vapor deposition (CVD), plasma enhanced CVD (PECVD), or atomic layer deposition (ALD).

In some embodiments, the plurality of mold insulation layers 110 and the plurality of sacrificial insulation layers 120 may respectively be formed of materials having etch selectivity with respect to each other. For example, the plurality of mold insulation layers 110 may be formed by using a silicon oxide, and the plurality of sacrificial insulation layers 120 may be formed by using a silicon nitride. The plurality of mold insulation layers 110 and the plurality of sacrificial insulation layers 120 may each have a thickness of tens of nanometers.

With reference to FIGS. 5A and 5B, a mask pattern (not shown) may be formed on the plurality of mold insulation layers 110 and the plurality of sacrificial insulation layers 120, and by using the mask pattern as an etching mask to remove parts of the plurality of mold insulation layers 110 and the plurality of sacrificial insulation layers 120, a first line opening 130L may be formed.

The first line opening 130L may expose the top surface of the etch stop layer 105. In some embodiments, the first line openings 130L may be apart from each other in the first horizontal direction (the X direction) and extend in the second horizontal direction (the Y direction).

In the drawings, for example, the first line openings 130L are described as having the same horizontal width for all heights; however, unlike the description in the drawings, the horizontal width may taper off toward the semiconductor substrate 101.

Then, the first buried insulation layer 130 filling the first line opening 130L may be formed. For example, the first buried insulation layer 130 may include a material having an etch selectivity for the mold insulation layer 110 and the sacrificial insulation layer 120. For example, the first buried insulation layer 130 may include a material containing polysilicon or carbon.

Figure 6A:
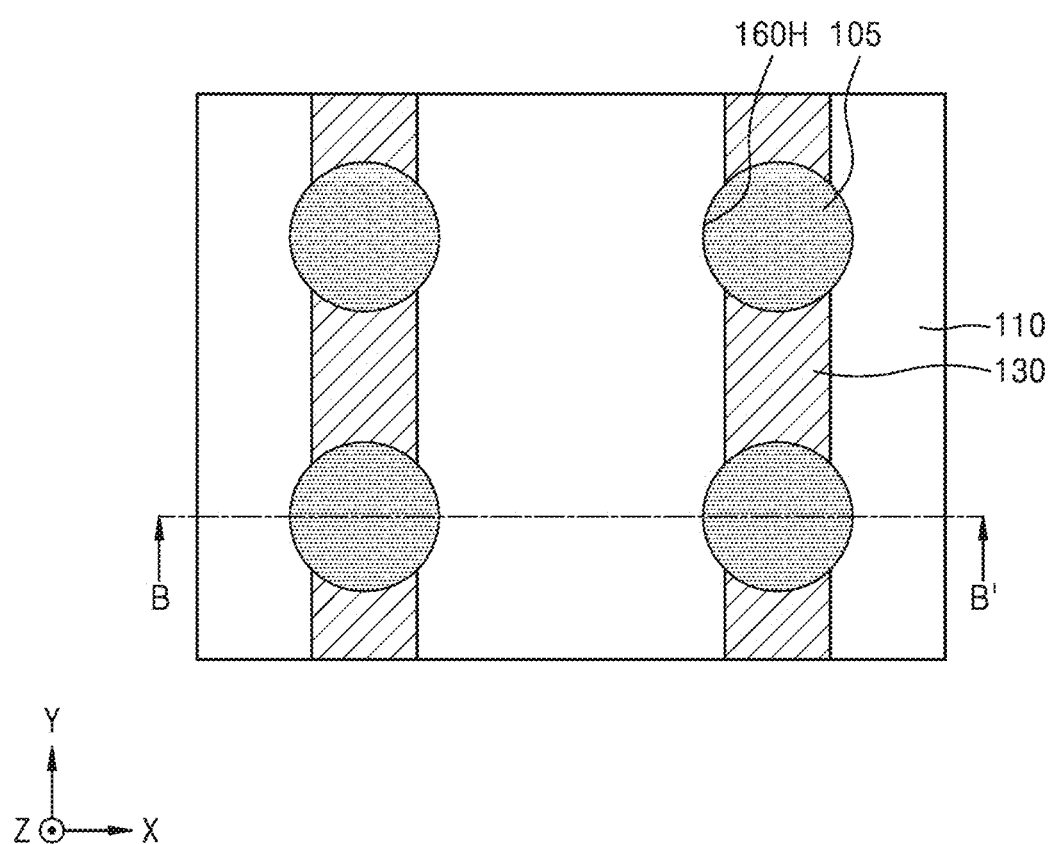
Figure 6B:
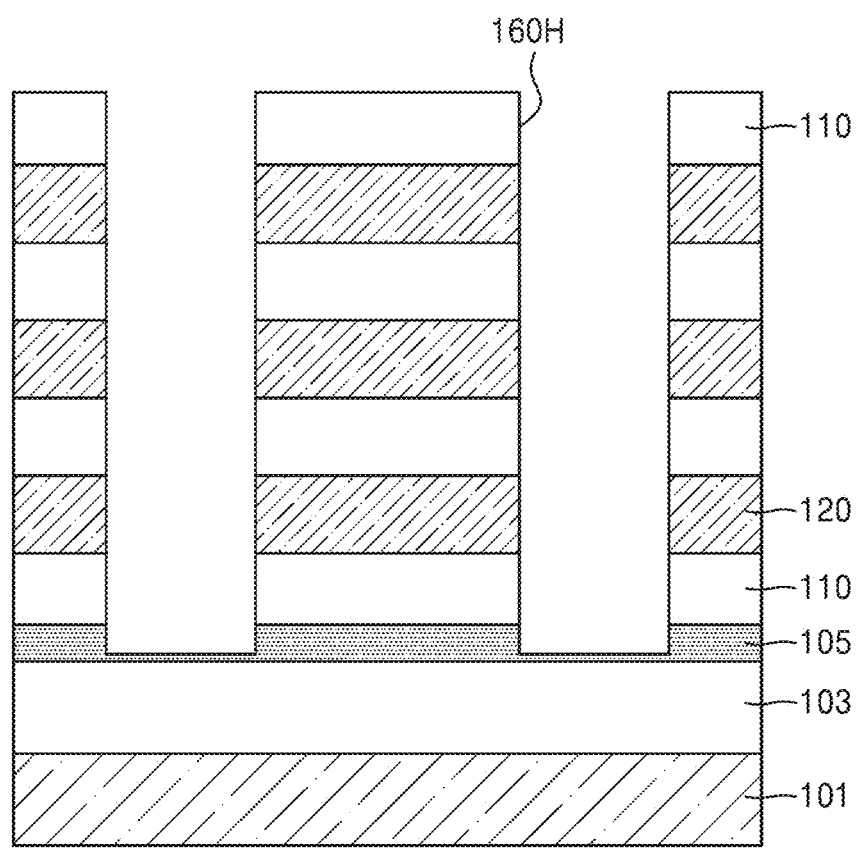

With reference to FIGS. 6A and 6B, a mask pattern (not shown) may be formed on the first buried insulation layer 130, and by using the mask pattern as an etching mask to remove parts of the first buried insulation layer 130, a first gate opening 160H may be formed.

The first gate opening 160H may expose the top surface of the etch stop layer 105. In some embodiments, the first gate openings 160L may be apart from each other in the first horizontal directions (the X direction and the Y direction) and extend in the vertical direction (the Z direction).

In the drawings, for example, the first gate openings 160L are described as having the same horizontal width for all heights; however, unlike the descriptions in the drawings, the horizontal width may taper off toward the semiconductor substrate 101. Also, the first gate opening 160H is described as having a circle-shaped horizontal cross-section in the drawings, but inventive concepts are not limited thereto.

Figure 7A:
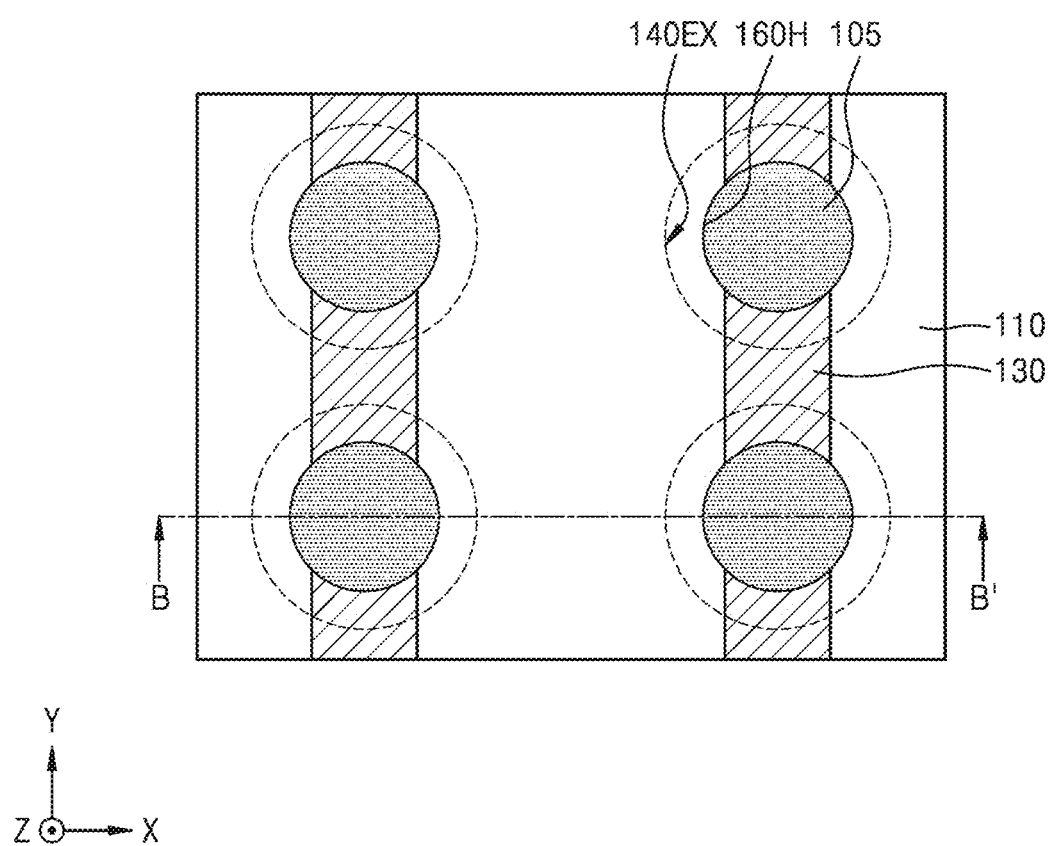
Figure 7B:
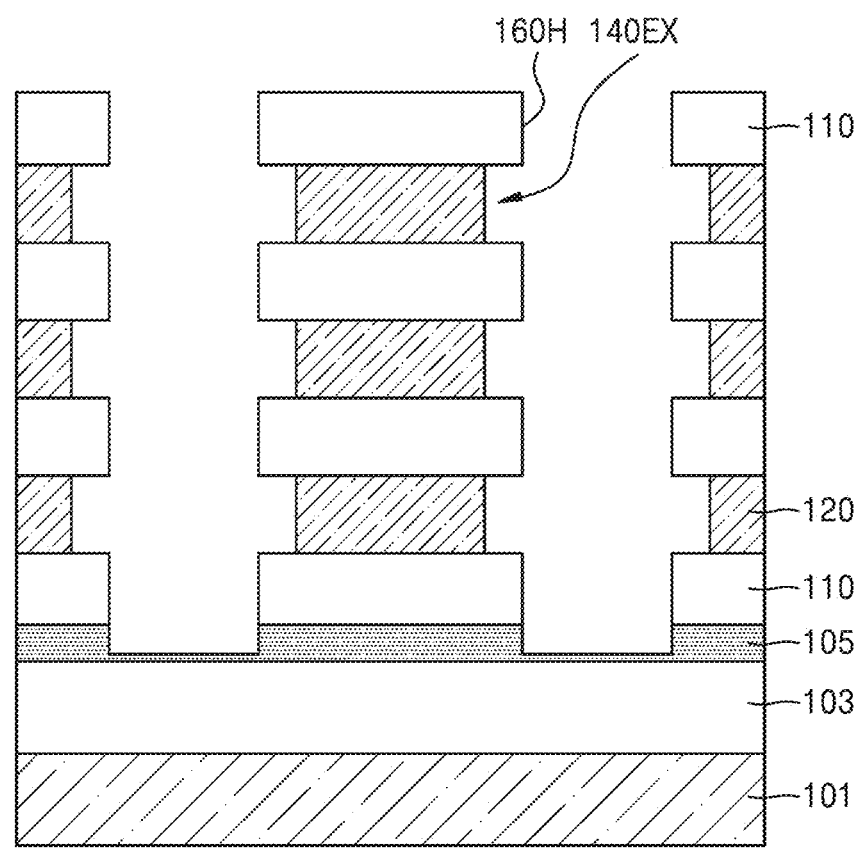

With reference to FIGS. 7A and 7B, by removing parts of the sacrificial insulation layer 120 exposed through the first gate opening 160H, an extension space 140EX connected with the first gate opening 160H may be formed.

As the extension space 140EX may be formed by removing parts of the sacrificial insulation layer 120 exposed through the first gate opening 160H, the extension space 140EX may have a constant width from the first gate opening 160H in the horizontal directions (the X direction and the Y direction). In some embodiments, the extension space 140EX may have a width of tens of nanometers from the first gate opening 160H in the horizontal directions (the X direction and the Y direction). A thickness occupied by the extension space 140EX may be substantially identical to a thickness of the sacrificial insulation layer 120.

Figure 8A:
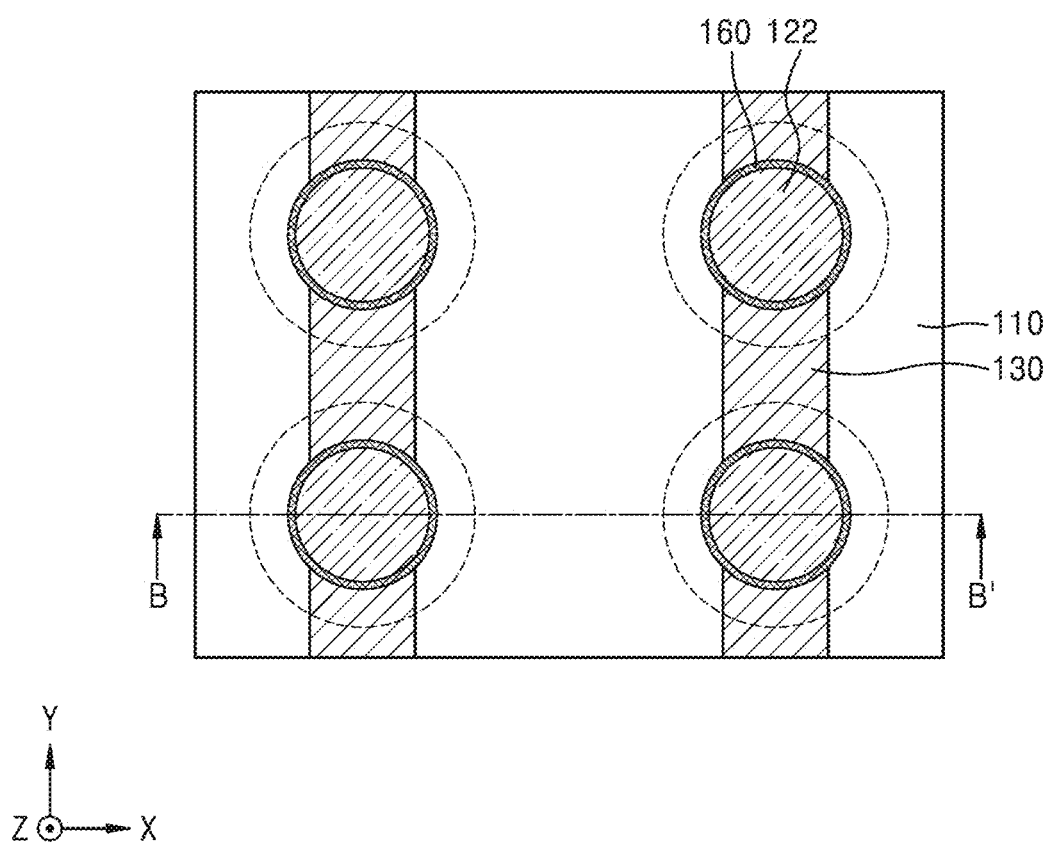
Figure 8B:
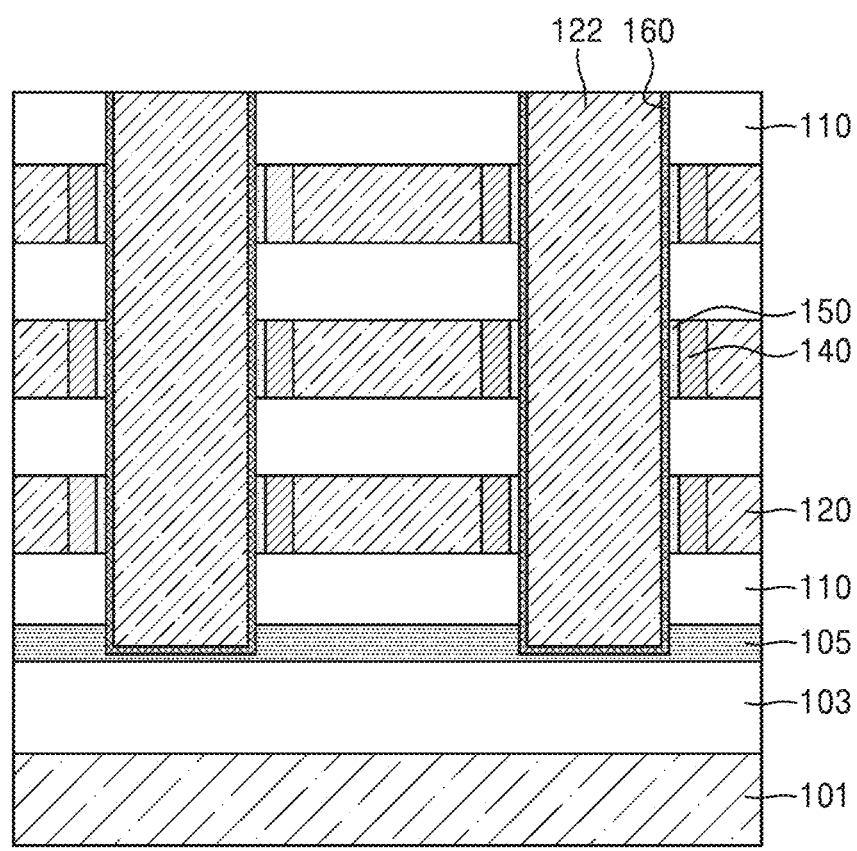

With reference to FIGS. 8A and 8B, the semiconductor pattern 140 may be formed on an inner wall of the extension space 140EX. The semiconductor pattern 140 may be formed by CVD, PECVD, or ALD.

Then, the charge trap layer 150 may be formed on an inner wall of the semiconductor pattern 140. The charge trap layer 150 may be formed by using at least one of thermal oxidation, CVD, PECVD, and ALD.

Then, the gate insulation layer 160 may be formed on an inner wall of the first gate opening 160H (see FIG. 6B). The gate insulation layer 160 may be formed by using at least one of thermal oxidation, CVD, PECVD, or ALD. The gate insulation layer 160 may be formed to cover both of an inner wall of the charge trap layer 150 and an inner wall of the mold insulation layer 110.

Then, a sacrificial buried layer 122 filling the first gate opening 160H (see FIG. 6B) may be formed. In some embodiments, the sacrificial buried layer 122 may be formed by using a silicon nitride.

Figure 9A:
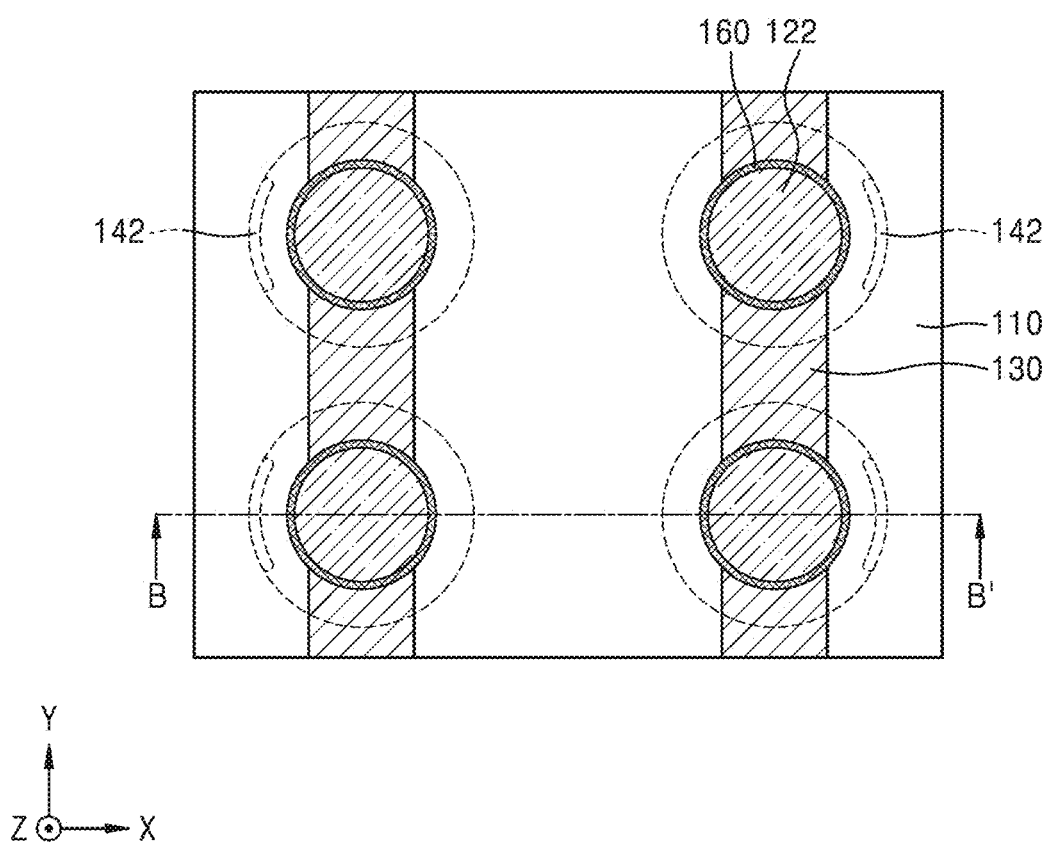
Figure 9B:
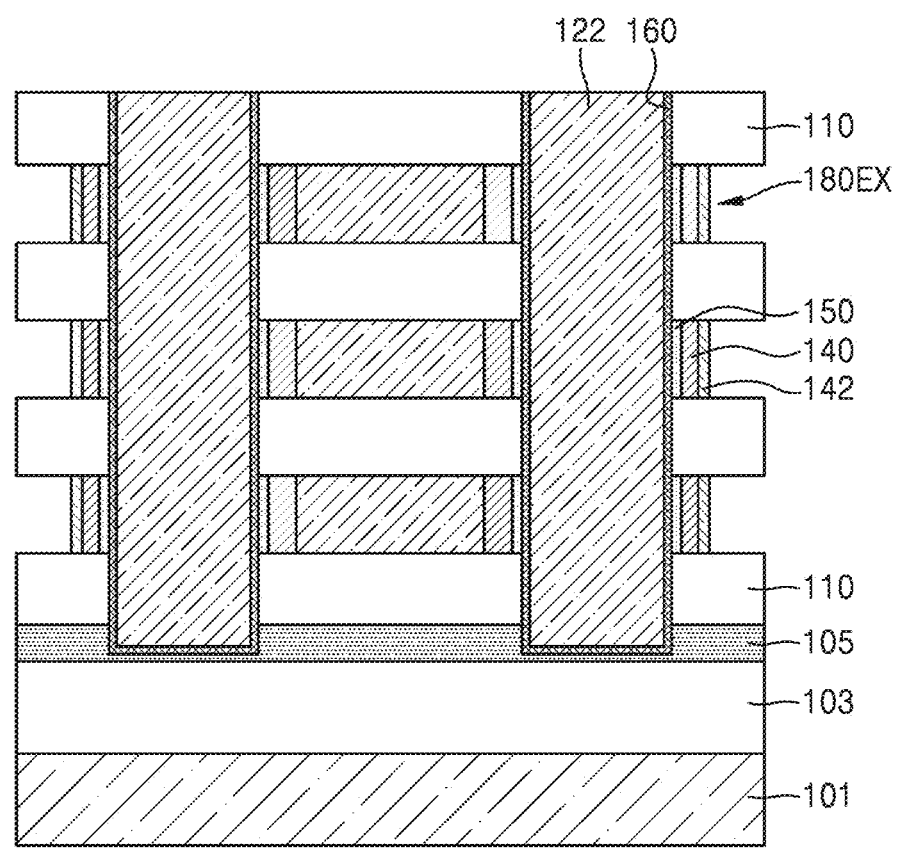

With reference to FIGS. 9A and 9B, by removing the plurality of sacrificial insulation layers 120 arranged at the edge portions, a source extension space 180EX exposing parts of one side wall of the semiconductor pattern 140 may be formed.

As the source extension space 180EX may be formed by removing parts of the sacrificial insulation layer 120 arranged at the edges, the source extension space 180EX may have a constant width from the semiconductor pattern 140 in the first horizontal direction (the X direction).

Then, the source region 142 may be formed on parts of one side wall of the semiconductor pattern 140 exposed by the source extension space 180EX by doping the parts with the first conductivity type impurity at a high concentration level. Here, the first conductivity type may be n type, and for example, the source region 142 may be an n+ region doped with an n type impurity at a high concentration level. In some embodiments, the process of doping with the first conductivity type impurity may be performed by a diffusion process or an epitaxial growth process.

Figure 10A:
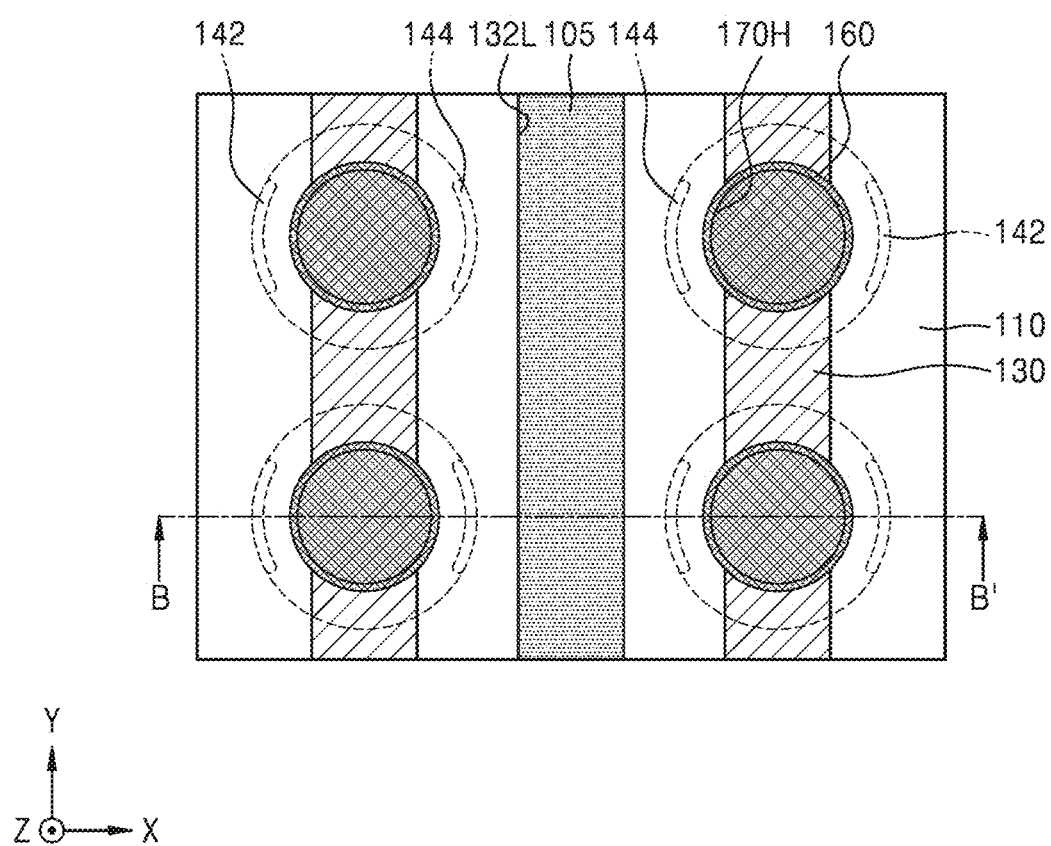
Figure 10B:
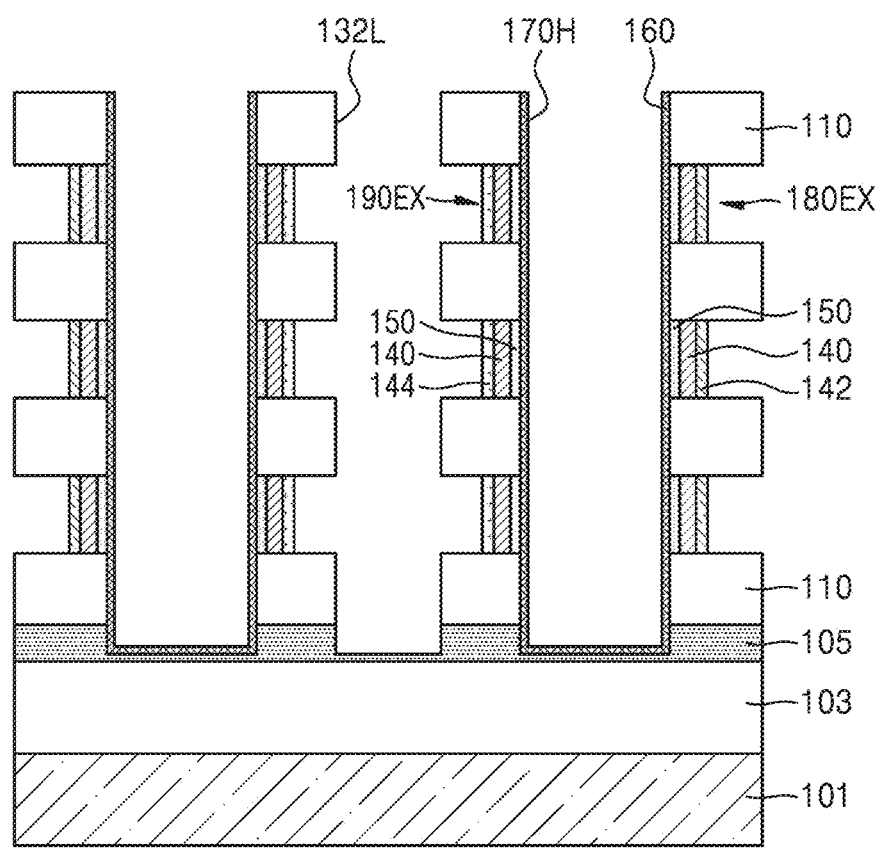

With reference to FIGS. 10A and 10B, by removing the plurality of sacrificial insulation layers 120 arranged at the center portion, a drain extension space 190EX exposing parts of another side wall of the semiconductor pattern 140 may be formed.

As the drain extension space 190EX may be formed by removing parts of the sacrificial insulation layer 120 arranged at the center, the drain extension space 190EX may have a constant width from the semiconductor pattern 140 in the first horizontal direction (the X direction).

Then, the drain region 144 may be formed on parts of another side wall of the semiconductor pattern 140 exposed by the drain extension space 190EX by doping the parts with the second conductivity type impurity at a high concentration level. Here, the second conductivity type may be p type, and for example, the drain region 144 may be a p+ region doped with a p type impurity at a high concentration level. In some embodiments, the process of doping with the second conductivity type impurity may be performed by a diffusion process or an epitaxial growth process.

Then, the sacrificial buried layer 122 may be removed to expose an inner wall of the gate insulation layer 160. In such a manner, a second gate opening 170H may be formed.

Figure 11A:
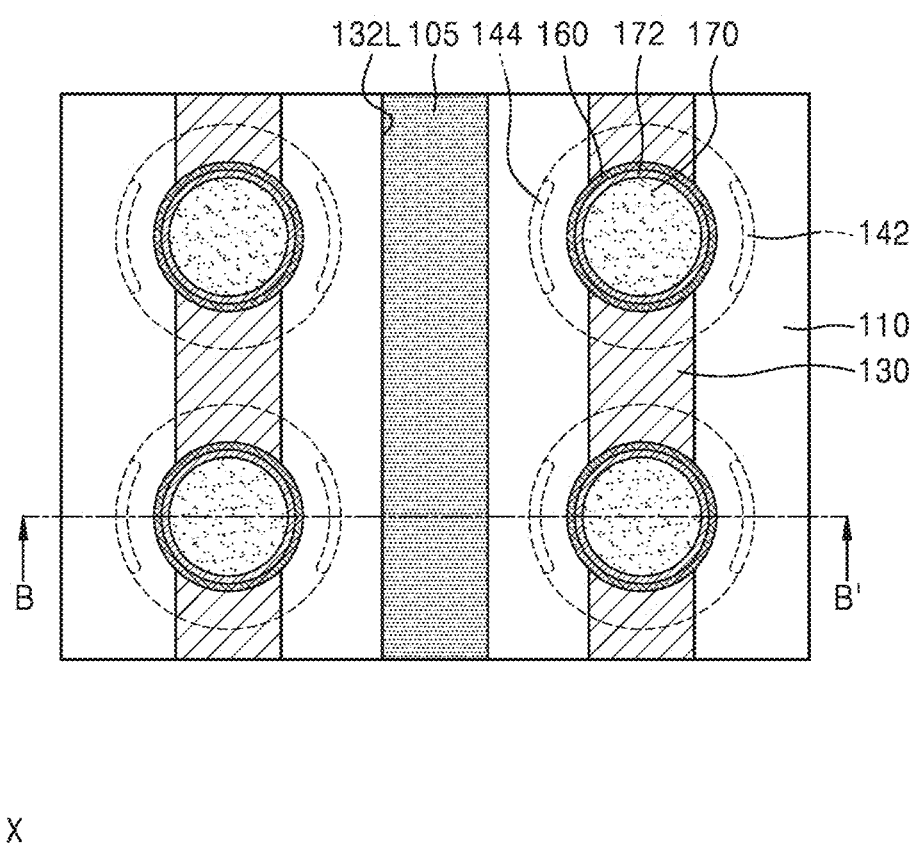
Figure 11B:
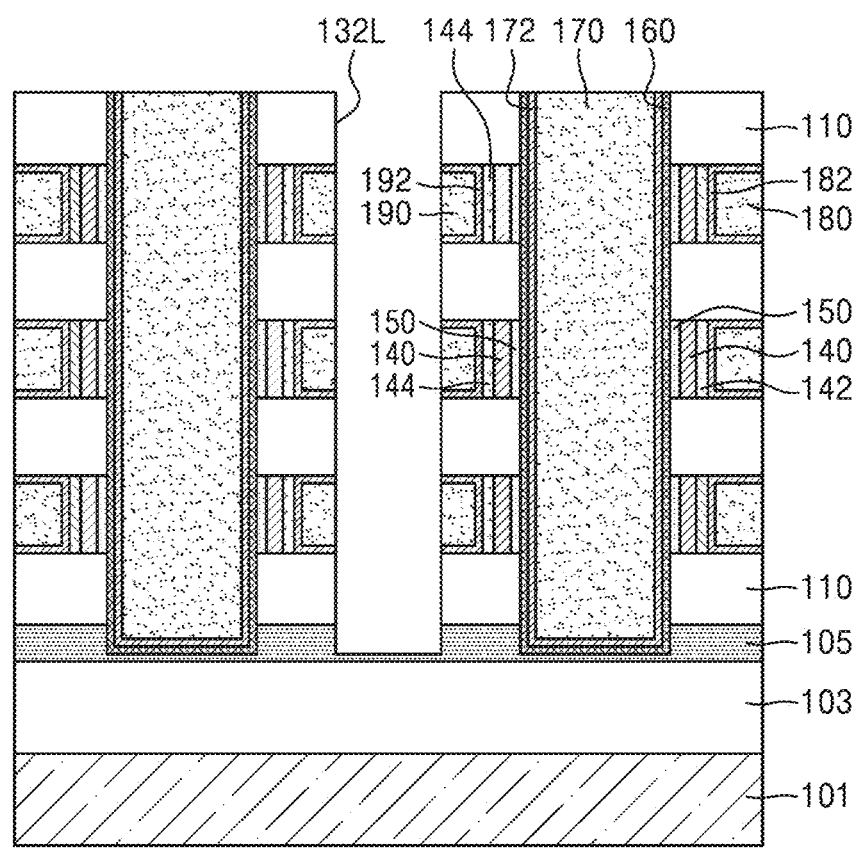

With reference to FIGS. 11A and 11B, a plurality of conductive layers filling the second gate opening 170H (see FIG. 10B), the source extension space 180EX (see FIG. 10B), and the drain extension space 190EX (see FIG. 10B) may be formed.

The plurality of conductive layers may include the gate electrode layer 170, the source line 180, and the drain line 190.

In some embodiments, the gate barrier layer 172 may be formed between the gate insulation layer 160 and the gate electrode layer 170. Specifically, the gate barrier layer 172 may be formed conformally on an inner wall of the second gate opening 170H (see FIG. 10B), and the gate electrode layer 170 may be formed to completely fill the inside of the second gate opening 170H (see FIG. 10B).

In some embodiments, the source barrier layer 182 may be formed between the source region 142 and the source line 180. Specifically, the source barrier layer 182 may be formed conformally on an inner wall of the source extension space 180EX (see FIG. 10B), and the source line 180 may be formed to completely fill the inside of the source extension space 180EX (see FIG. 10B).

In some embodiments, the drain barrier layer 192 may be formed between the drain region 144 and the drain line 190. Specifically, the drain barrier layer 192 may be formed conformally on an inner wall of the drain extension space 190EX (see FIG. 10B), and the drain line 190 may be formed to completely fill the inside of the drain extension space 190EX (see FIG. 10B).

With reference to FIG. 1B, the second buried insulation layer 132 may be formed to fill a second line opening 132L. The second buried insulation layer 132 may include a silicon oxide, a silicon nitride, or combinations thereof. The second buried insulation layer 132 may be arranged between the plurality of gate structures GS.

Through the above-described manufacturing processes, the semiconductor memory device 10 according to an embodiment of inventive concepts may be completed.

Figure 12A:
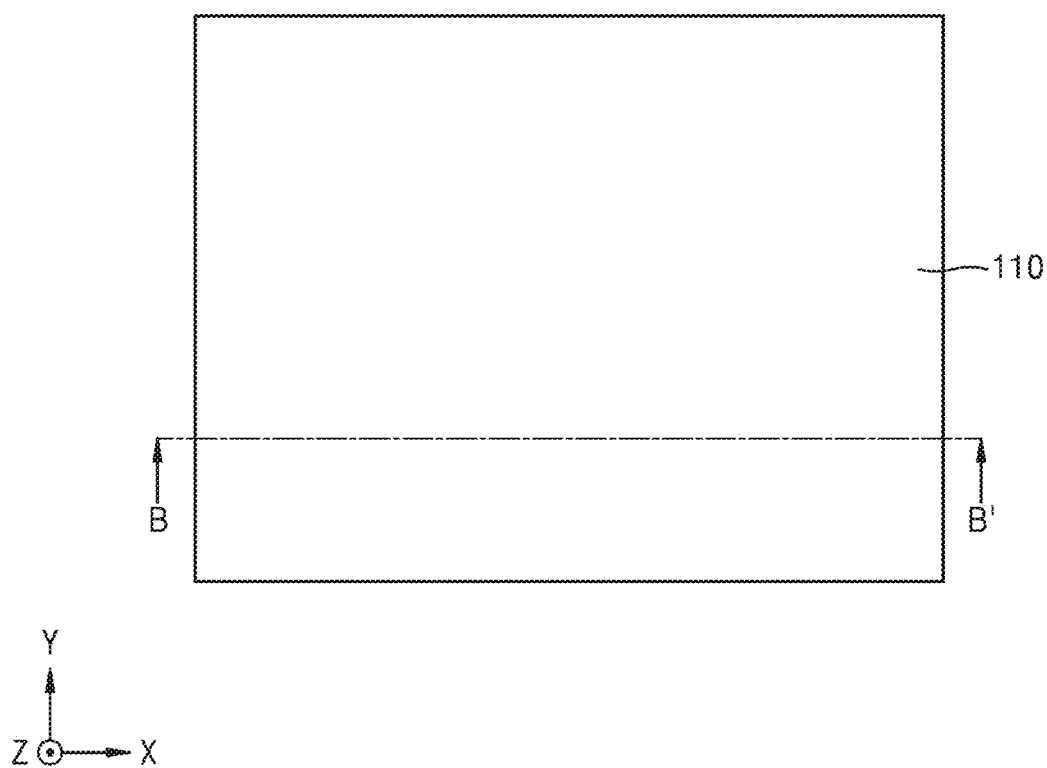
Figure 12B:
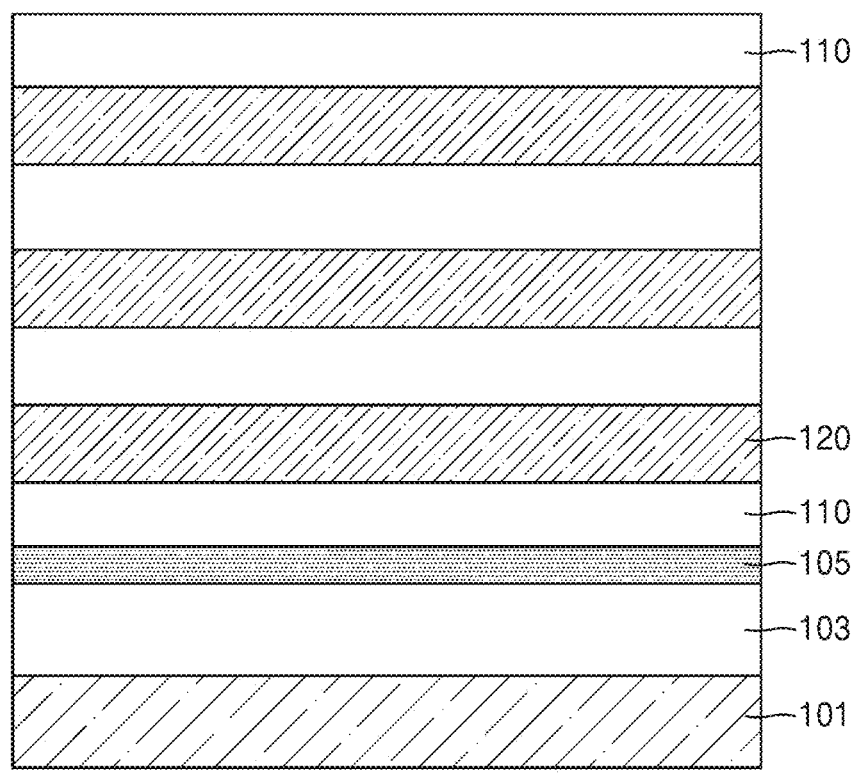
Figure 13A:
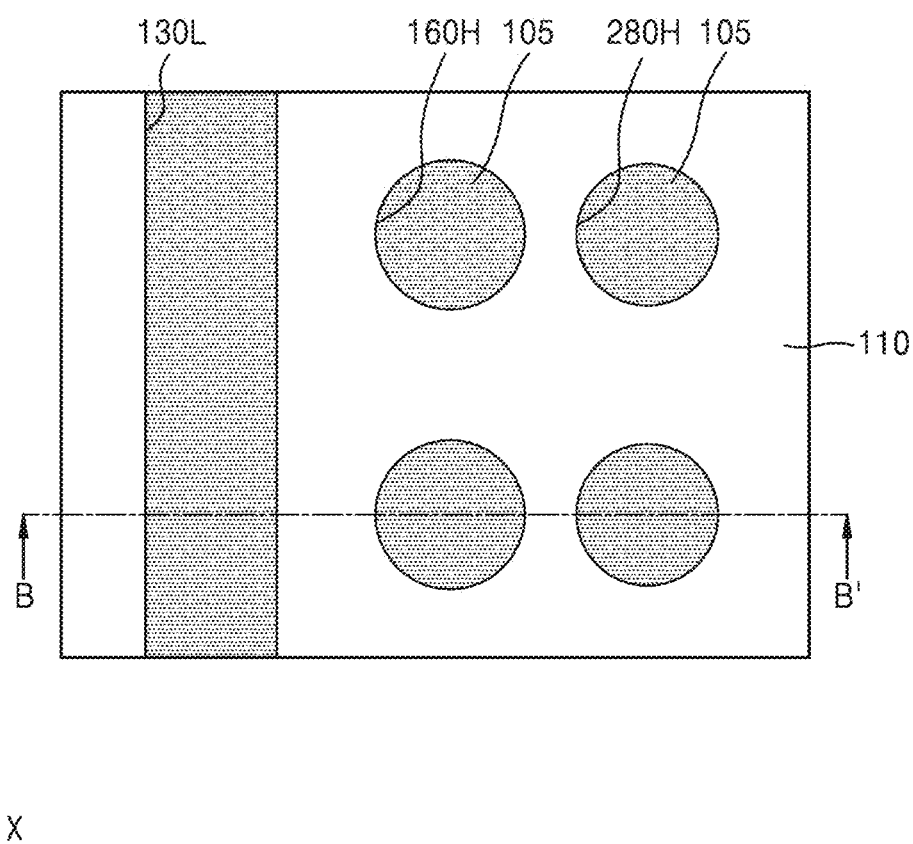
Figure 13B:
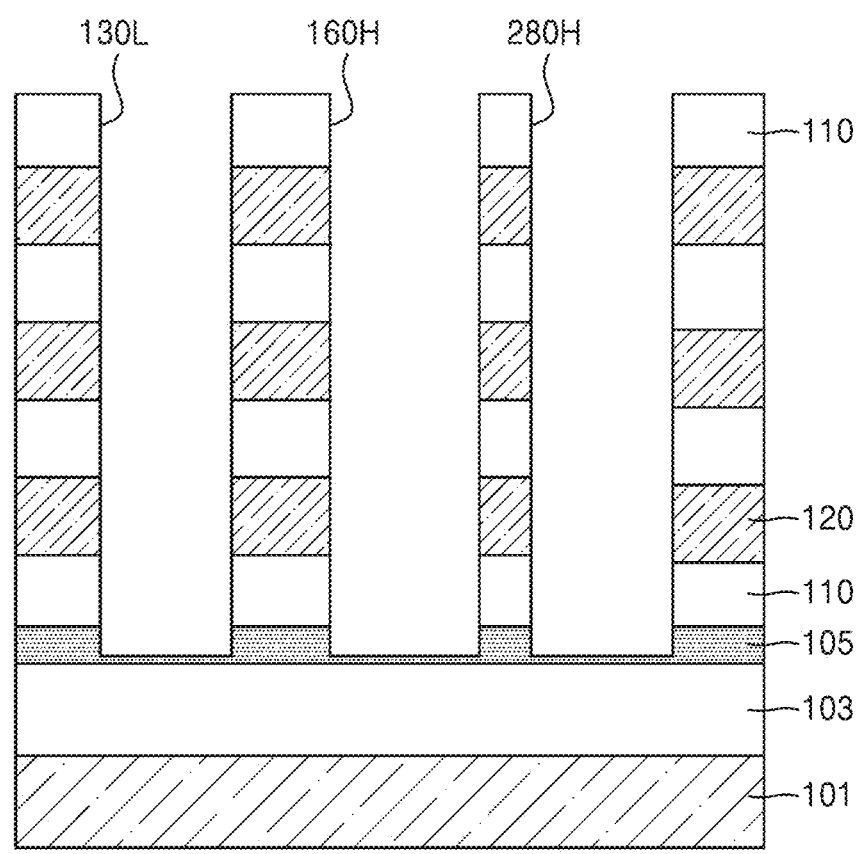

FIGS. 12A, 13A, . . . and 20A are plane views illustrating in the order of process a method of manufacturing a semiconductor memory device according to another embodiment of inventive concepts, and FIGS. 12B, 13B, . . . and 20B are cross-sectional views taken along the line B-B' of FIGS. 12A, 13A, . . . 20A, respectively.

With reference to FIGS. 12A and 12B, the base insulation layer 103 and the etch stop layer 105 may be formed on the semiconductor substrate 101. The plurality of mold insulation layers 110 and the plurality of sacrificial insulation layers 120 may be formed alternately and sequentially on the etch stop layer 105.

The plurality of mold insulation layers 110 and the plurality of sacrificial insulation layers 120 may be formed by CVD, PECVD, or ALD.

In some embodiments, the plurality of mold insulation layers 110 and the plurality of sacrificial insulation layers 120 may respectively include materials having etch selectivity with respect to each other. For example, the plurality of mold insulation layers 110 may be formed by using a silicon oxide, and the plurality of sacrificial insulation layers 120 may be formed by using a silicon nitride. The plurality of mold insulation layers 110 and the plurality of sacrificial insulation layers 120 may each have a thickness of tens of nanometers.

With reference to FIGS. 13A and 13B, the first line opening 130L, the first gate opening 160H, and a first source opening 280H may be formed by forming a mask pattern (not shown) on the plurality of mold insulation layers 110 and the plurality of sacrificial insulation layers 120, and then removing parts of the plurality of mold insulation layers 110 and the sacrificial insulation layers 120 by using the mask pattern as an etching mask.

The top surface of the etch stop layer 105 may be exposed at the bottoms of the first line opening 130L, the first gate opening 160H, and the first source opening 280H.

In some embodiments, the first line openings 130L may be formed to be apart from each other in the first horizontal direction (the X direction) and have a line shape extending in the second horizontal direction (the Y direction).

In some embodiments, the first gate opening 160H and the first source opening 280H may be formed to have a circle or oval-shaped horizontal cross-section. The plurality of first gate openings 160H may be apart from each other in the second horizontal direction (the Y direction), and extend in the vertical direction (the Z direction). The plurality of first source openings 280H may be apart from each other in the second horizontal direction (the Y direction), and extend in the vertical direction (the Z direction).

Although the first line opening 130L, the first gate opening 160H, and the first source opening 280H are illustrated as having the same horizontal width for all heights, unlike this, they may have a horizontal width tapering off toward the semiconductor substrate 101.

Figure 14A:
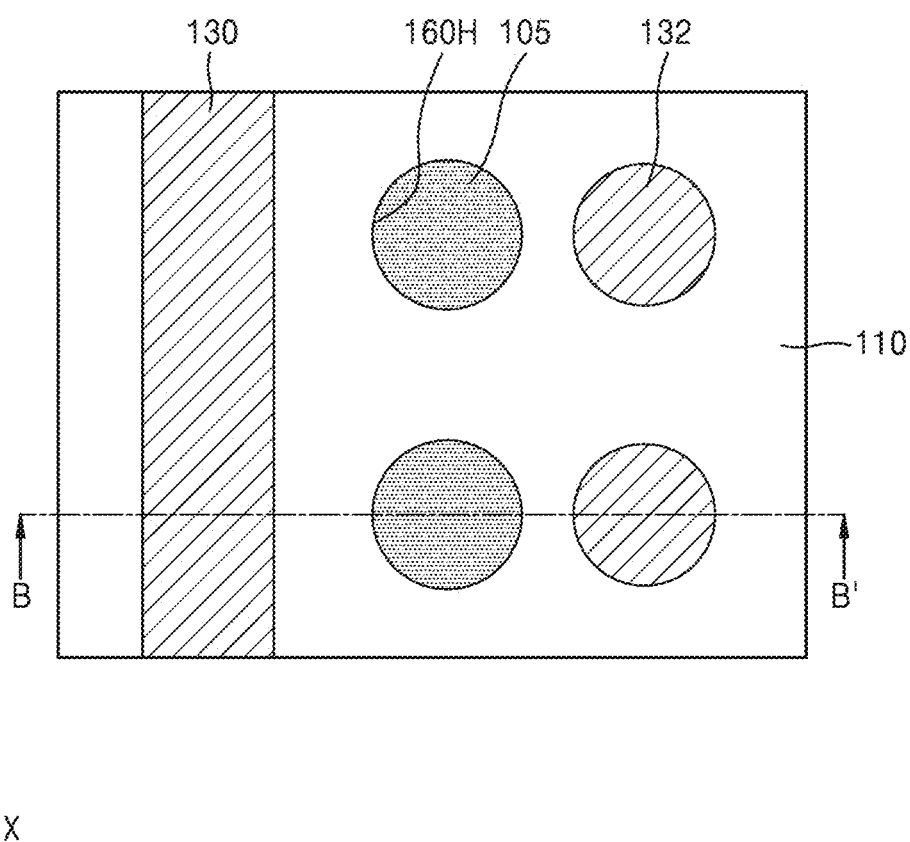
Figure 14B:
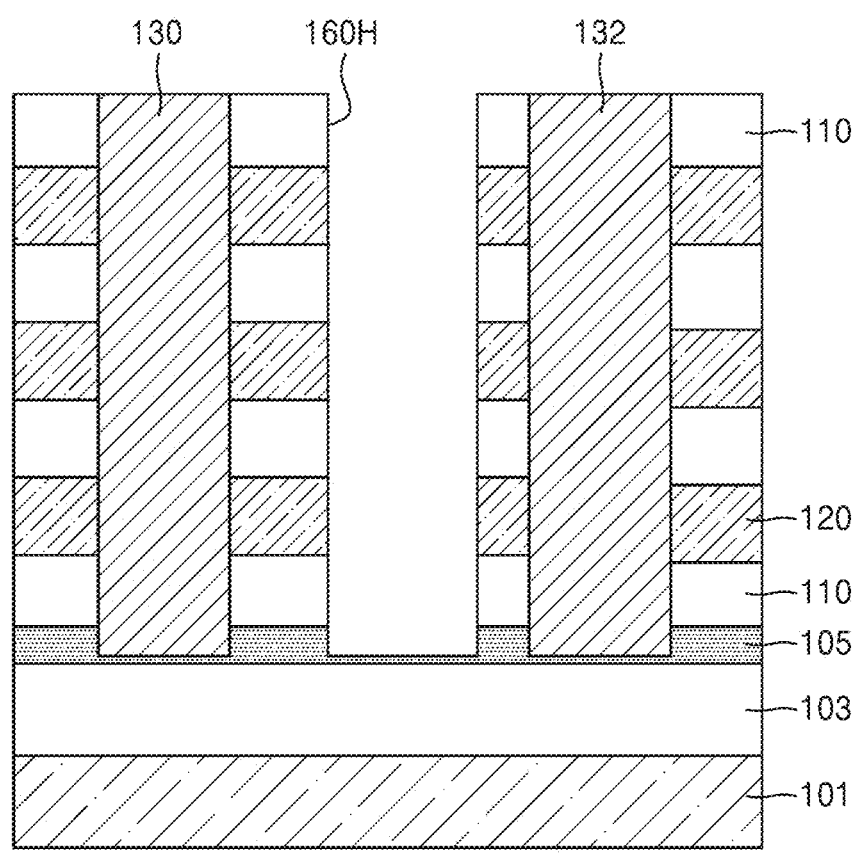

With reference to FIGS. 14A and 14B, the first buried insulation layer 130 filling the first line opening 130L, and the second buried insulation layer 132 filing the first source opening 280H may be formed.

The first buried insulation layer 130 and the second buried insulation layer 132 may include a material having an etch selectivity for the mold insulation layer 110 and the sacrificial insulation layer 120. For example, the first buried insulation layer 130 and the second buried insulation layer 132 may include a material containing polysilicon or carbon.

Figure 15A:
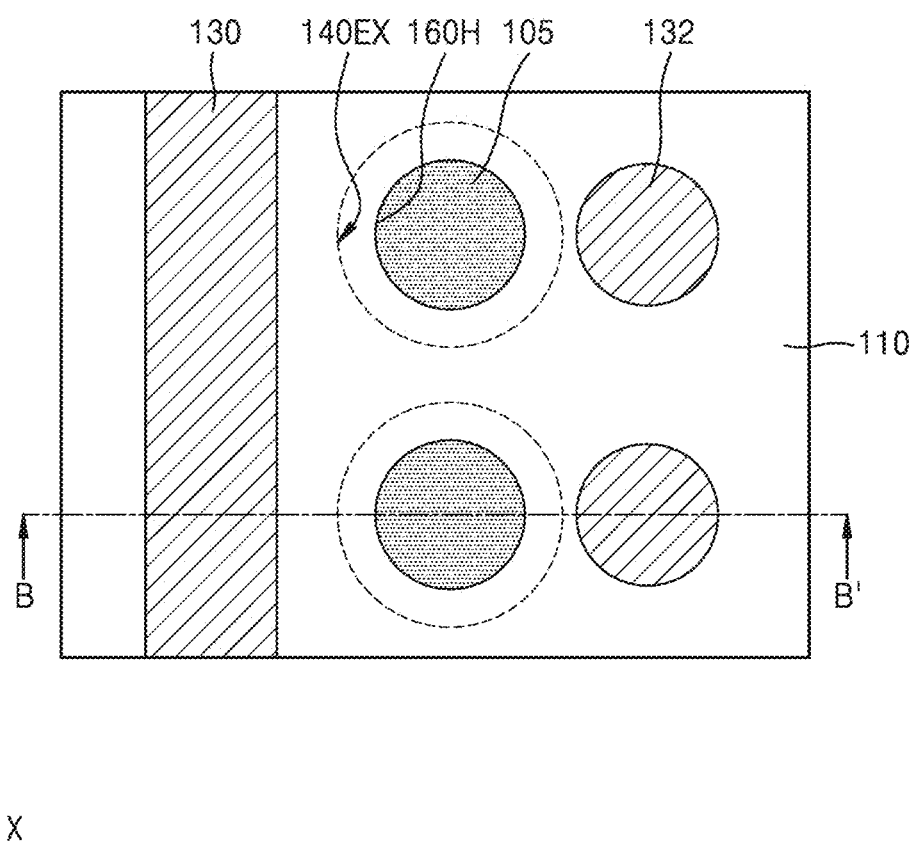
Figure 15B:
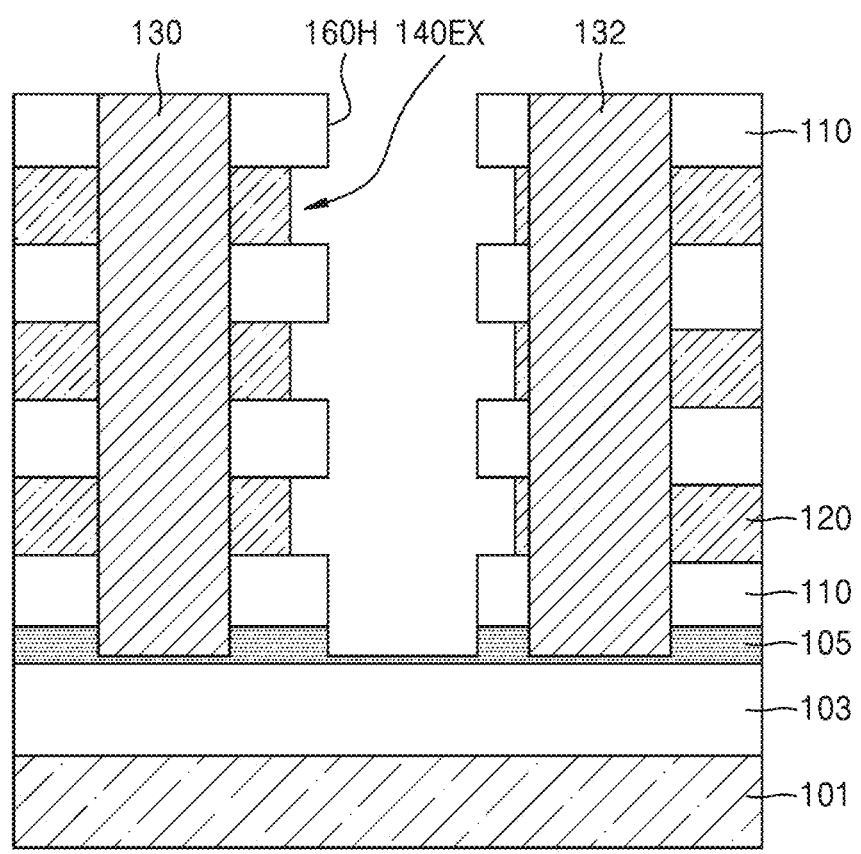

With reference to FIGS. 15A and 15B, by removing parts of the sacrificial insulation layer 120 exposed through the first gate opening 160H, the extension space 140EX connected with the first gate opening 160H may be formed.

As the extension space 140EX may be formed by removing parts of the sacrificial insulation layer 120 exposed through the first gate opening 160H, the extension space 140EX may have a constant width from the first gate opening 160H in the horizontal directions (the X direction and the Y direction). In some embodiments, the extension space 140EX may have a width of tens of nanometers from the first gate opening 160H in the horizontal directions (the X direction and the Y direction). A thickness occupied by the extension space 140EX may be substantially identical to a thickness of the sacrificial insulation layer 120.

Figure 16A:
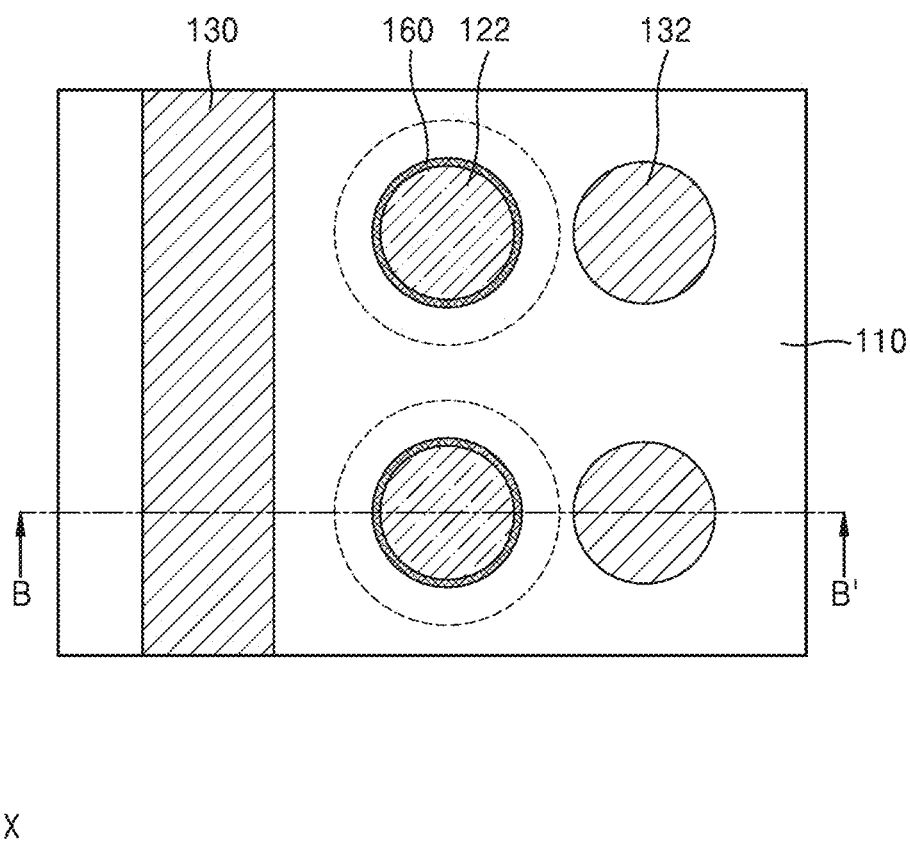
Figure 16B:
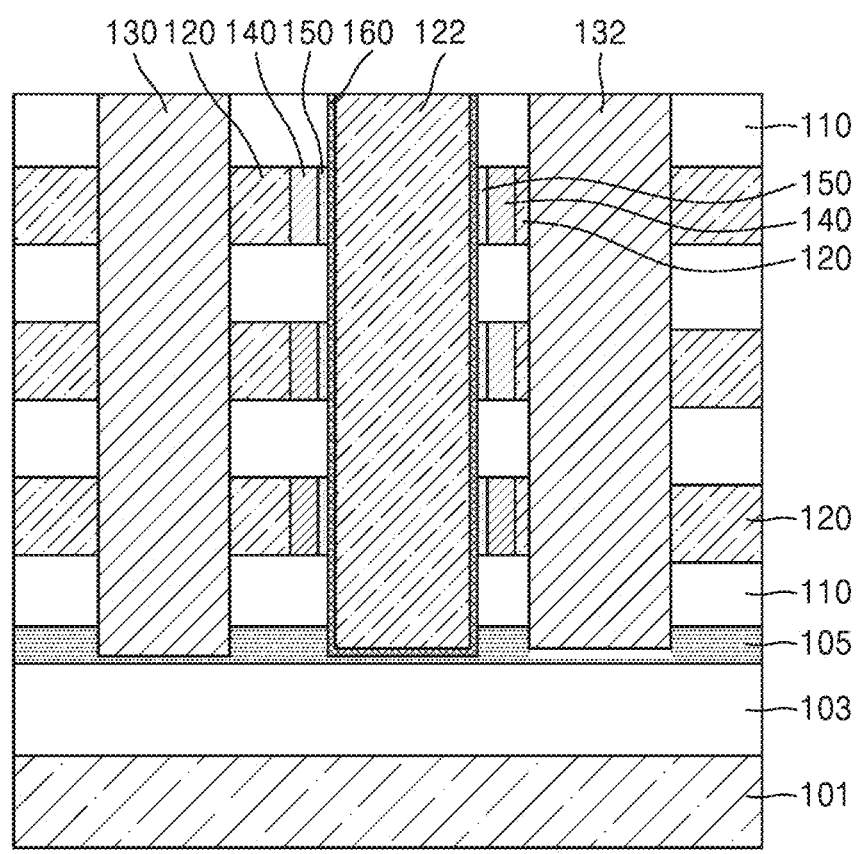

With reference to FIGS. 16A and 16B, the semiconductor pattern 140 may be formed on an inner wall of the extension space 140EX. The semiconductor pattern 140 may be formed by CVD, PECVD, or ALD.

Then, the charge trap layer 150 may be formed on an inner wall of the semiconductor pattern 140. The charge trap layer 150 may be formed by using at least one of thermal oxidation, CVD, PECVD, or ALD.

Then, the gate insulation layer 160 may be formed on an inner wall of the first gate opening 160H (see FIG. 14B). The gate insulation layer 160 may be formed by using at least one of thermal oxidation, CVD, PECVD, or ALD. The gate insulation layer 160 may be formed to cover both of an inner wall of the charge trap layer 150 and an inner wall of the mold insulation layer 110.

Then, the sacrificial buried layer 122 filling the first gate opening 160H (see FIG. 14B) may be formed. In some embodiments, the sacrificial buried layer 122 may be formed by using a silicon nitride.

Figure 17A:
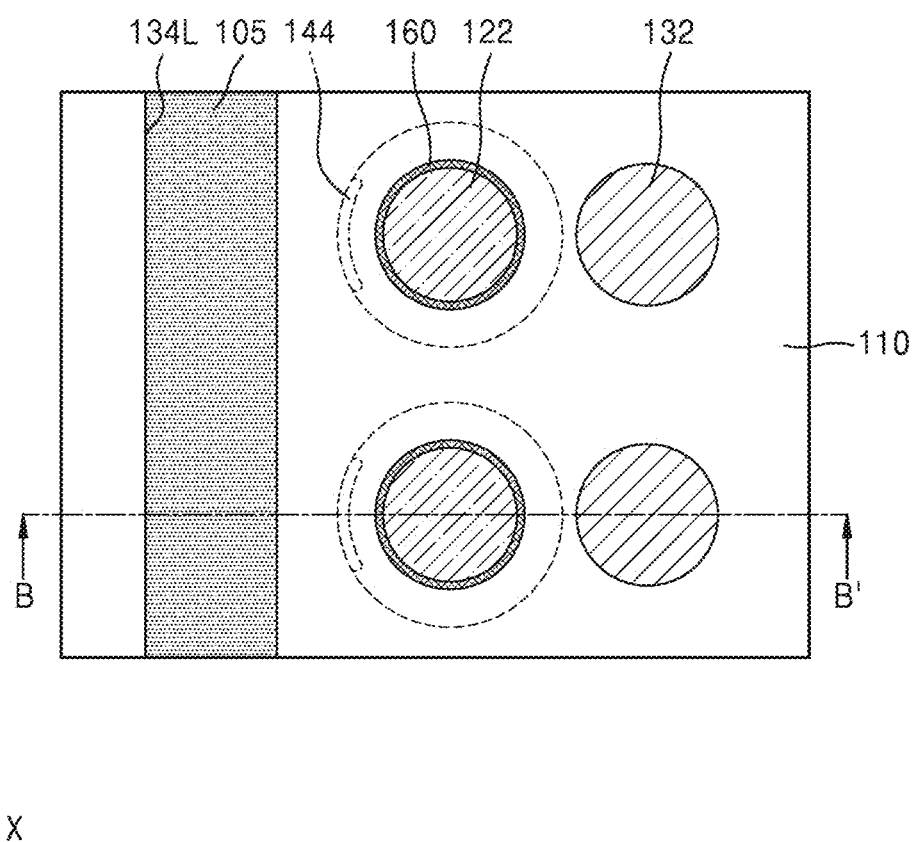
Figure 17B:
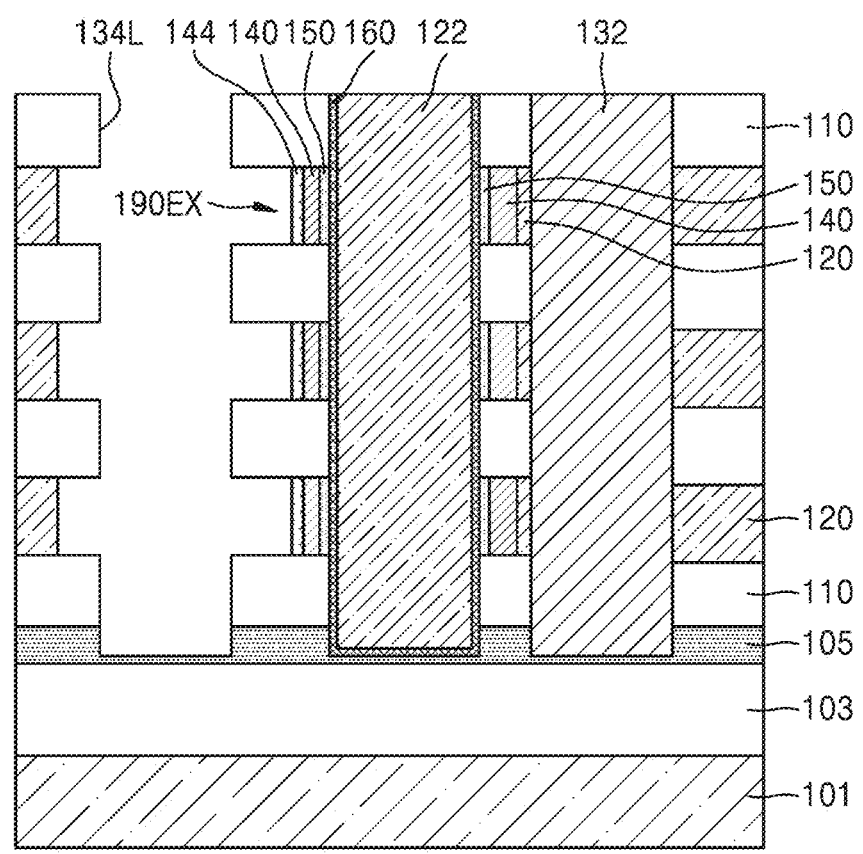

With reference to FIGS. 17A and 17B, by removing the first buried insulation layer 130 (see FIG. 16B) and the plurality of sacrificial insulation layers 120 connected thereto, the drain extension space 190EX exposing parts of one side wall of the semiconductor pattern 140 may be formed.

As the drain extension space 190EX may be formed by removing parts of the sacrificial insulation layer 120 connected to the first buried insulation layer 130 (see FIG. 16B), the drain extension space 190EX may have a constant width from the semiconductor pattern 140 in the first horizontal direction (the X direction). In this manner, a cut line opening 134L may be formed.

Then, the drain region 144 may be formed on parts of one side wall of the semiconductor pattern 140 exposed by the drain extension space 190EX by doping the parts with the second conductivity type impurity at a high concentration level. Here, the second conductivity type may be p type, and for example, the drain region 144 may be a p+ region doped with a p type impurity at a high concentration level. In some embodiments, the process of doping with the second conductivity type impurity may be performed by a diffusion process or an epitaxial growth process.

Figure 18A:
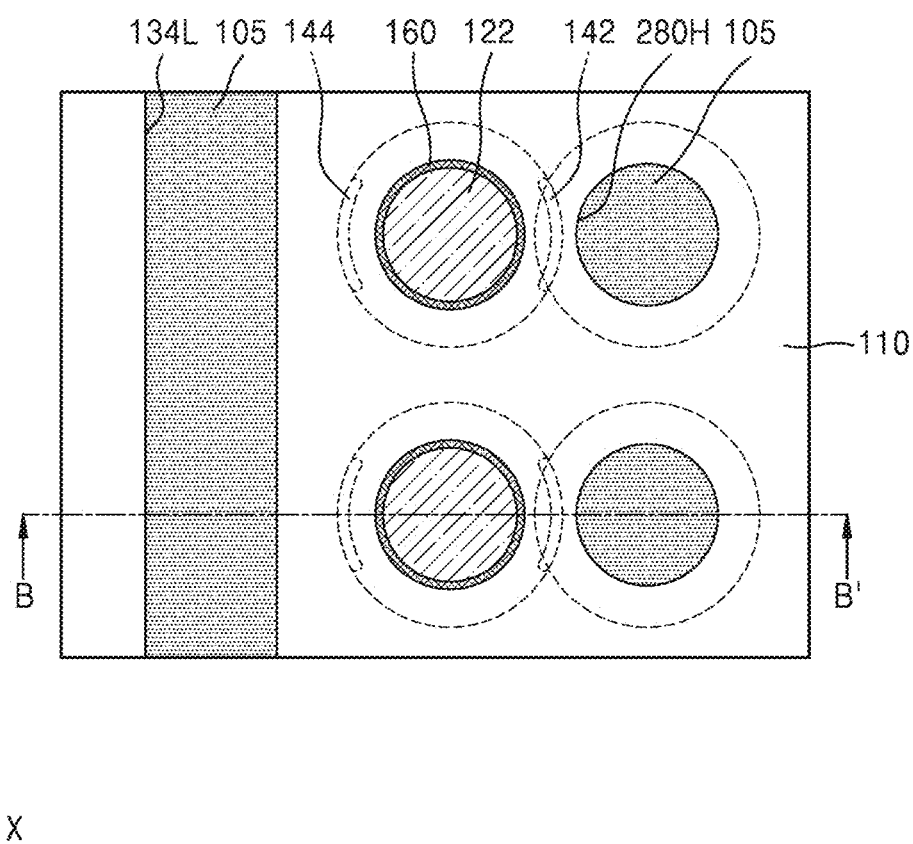
Figure 18B:
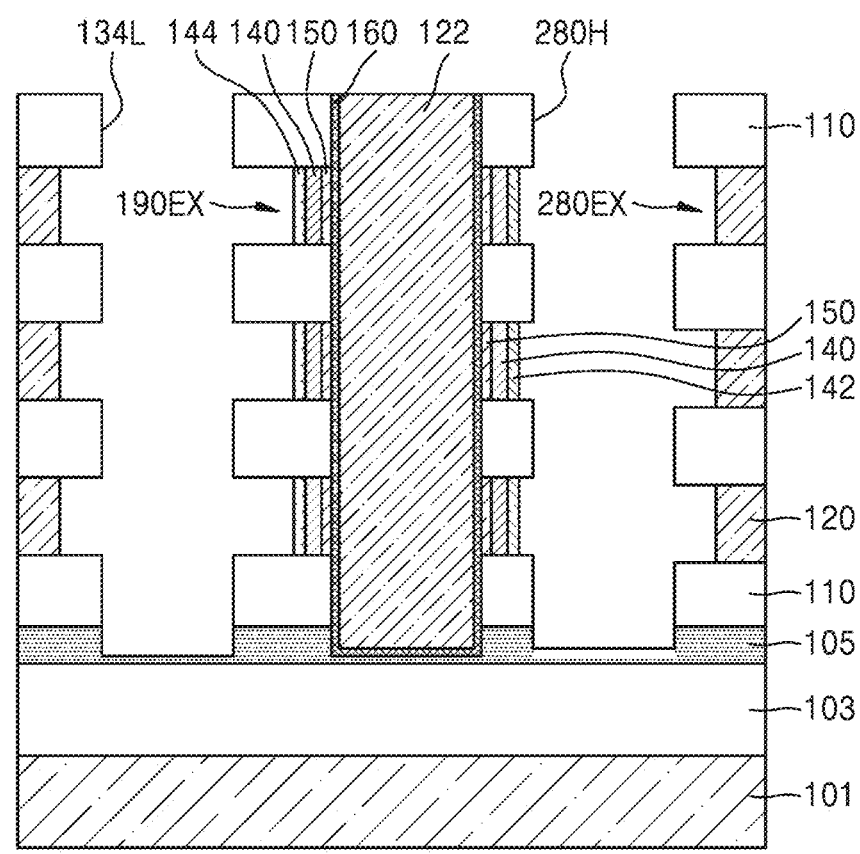

With reference to FIGS. 18A and 18B, by removing the second buried insulation layer 132 (see FIG. 17B) and the plurality of sacrificial insulation layers 120 connected thereto, a source extension space 280EX exposing parts of another side wall of the semiconductor pattern 140 may be formed.

As the source extension space 280EX may be formed by removing parts of the sacrificial insulation layer 120 connected to the second buried insulation layer 132 (see FIG. 17B), the source extension space 280EX may have a constant width from the semiconductor pattern 140 in the first horizontal direction (the X direction).

Then, the source region 142 may be formed on parts of another side wall of the semiconductor pattern 140 exposed by the source extension space 280EX by doping the parts with the first conductivity type impurity at a high concentration level. Here, the first conductivity type may be n type, and for example, the source region 142 may be an n+ region doped with an n type impurity at a high concentration level. In some embodiments, the process of doping with the first conductivity type impurity may be performed by a diffusion process or an epitaxial growth process.

Figure 19A:
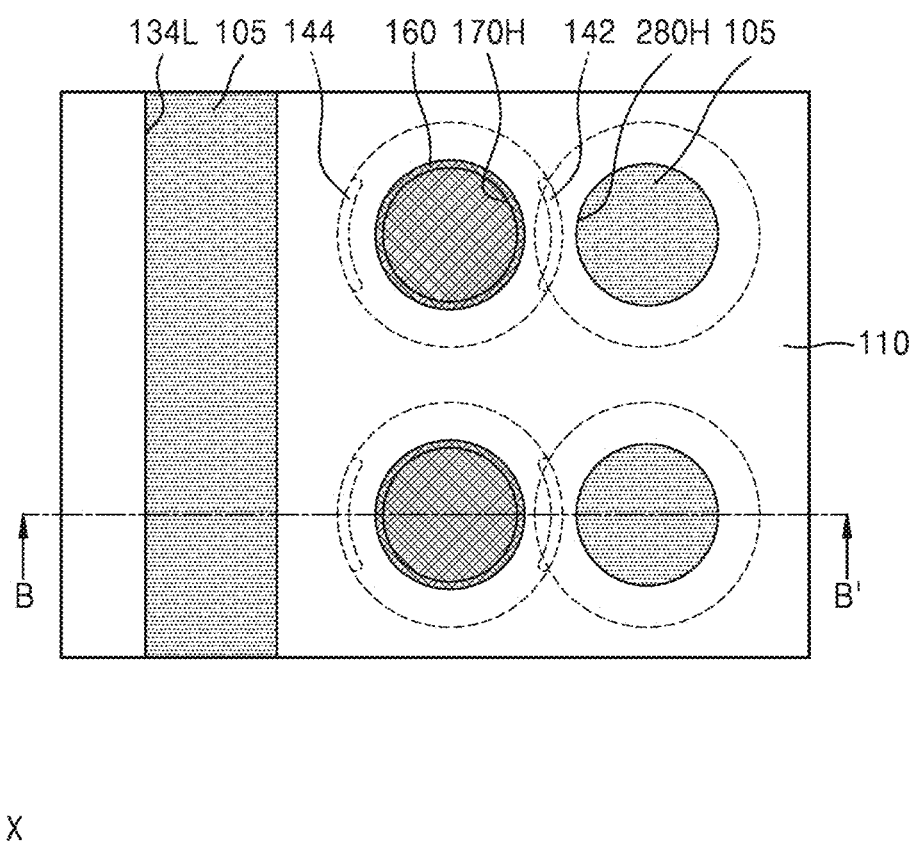
Figure 19B:
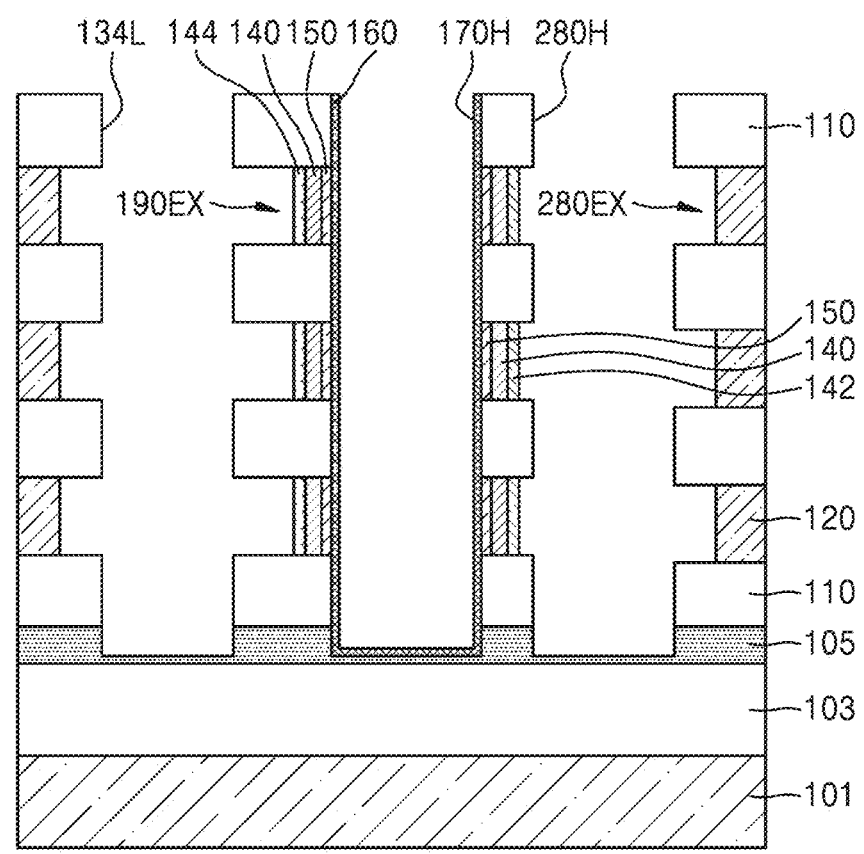

With reference to FIGS. 19A and 19B, the sacrificial buried layer 122 may be removed to expose an inner wall of the gate insulation layer 160. In such a manner, the second gate opening 170H may be formed.

Figure 20A:
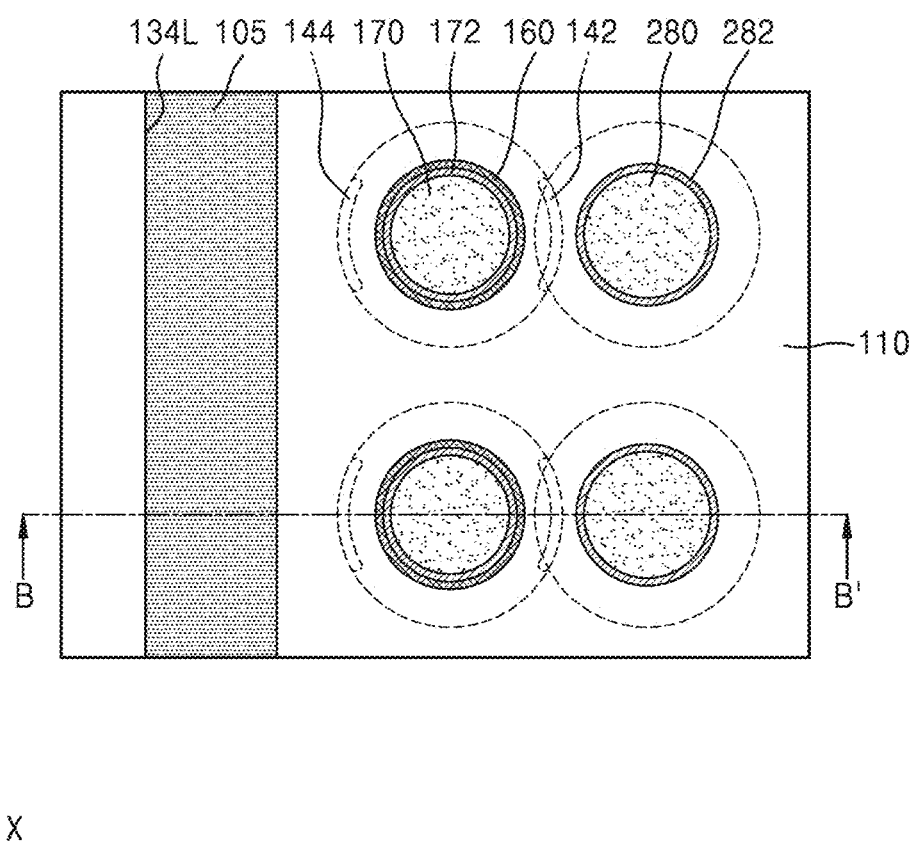
Figure 20B:
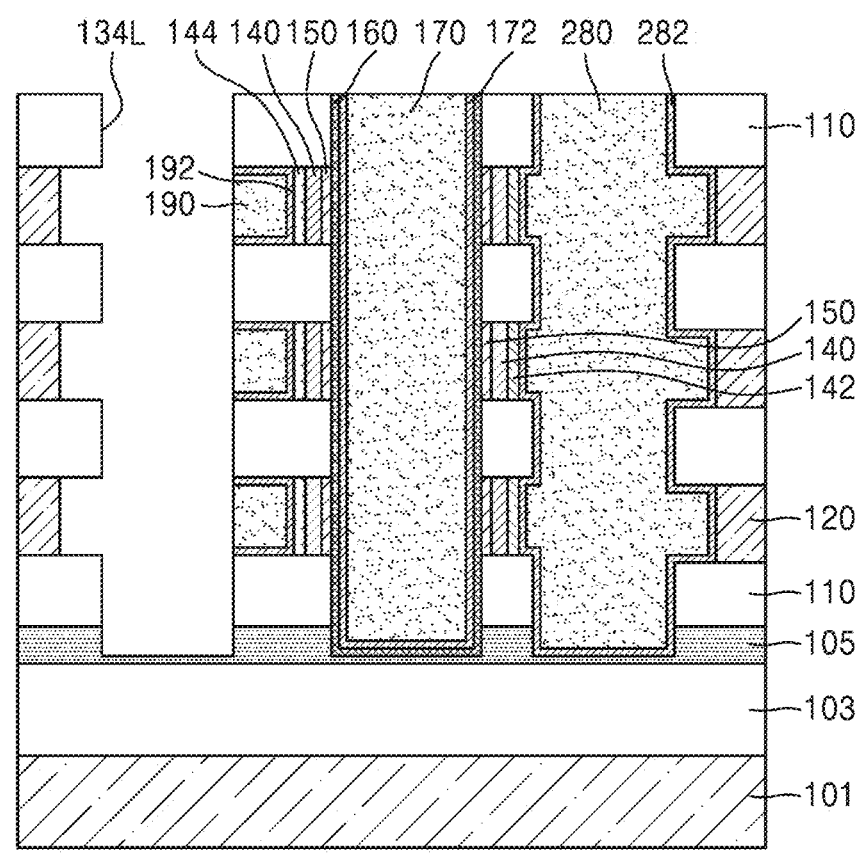

With reference to FIGS. 20A and 20B, a plurality of conductive layers filling the second gate opening 170H (see FIG. 10B), the source extension space 280EX (see FIG. 10B), and the drain extension space 190EX (see FIG. 10B) may be formed.

The plurality of conductive layers may include the gate electrode layer 170, the drain line 190, and the source line 280.

In some embodiments, the gate barrier layer 172 may be formed between the gate insulation layer 160 and the gate electrode layer 170. Specifically, the gate barrier layer 172 may be formed conformally on an inner wall of the second gate opening 170H (see FIG. 10B), and the gate electrode layer 170 may be formed to completely fill the inside of the second gate opening 170H (see FIG. 10B).

In some embodiments, the drain barrier layer 192 may be formed between the drain region 144 and the drain line 190. Specifically, the drain barrier layer 192 may be formed conformally on an inner wall of the drain extension space 190EX (see FIG. 10B), and the drain line 190 may be formed to completely fill the inside of the drain extension space 190EX (see FIG. 10B).

In some embodiments, the source barrier layer 282 may be formed between the source region 142 and the source line 280. Specifically, the source barrier layer 282 may be formed conformally on an inner wall of the source extension space 280EX (see FIG. 10B), and the source line 280 may be formed to completely fill the source extension space 280EX (see FIG. 10B) and the inside of the first source opening 280H (see FIG. 10B).

With reference to FIG. 2B, the buried insulation layer 134 may be formed to fill the cut line opening 134L. The buried insulation layer 134 may include, for example, a silicon oxide, a silicon nitride, or combinations thereof. The buried insulation layer 134 may be arranged spaced apart from the plurality of gate structures GS.

Through the above-described manufacturing processes, the semiconductor memory device 20 according to an embodiment of inventive concepts may be completed.

While embodiments of inventive concepts has been particularly shown and described with reference to embodiments thereof, it will be understood that various changes in form and details may be made therein without departing from the spirit and scope of the following claims.

What is claimed is:

1. A semiconductor memory device comprising:
   a semiconductor substrate;
   a gate structure extending in a vertical direction on the semiconductor substrate, the gate structure including a gate insulation layer and a gate electrode layer;
   a plurality of charge trap layers each having a horizontal cross-section with a first ring shape surrounding the gate structure, and the plurality of charge trap layers being spaced apart from each other in the vertical direction;
   a plurality of semiconductor patterns each having a horizontal cross-section with a second ring shape surrounding the plurality of charge trap layers, and the plurality of semiconductor patterns being spaced apart from each other in the vertical direction;

a source region and a source line at one end of each of the plurality of semiconductor patterns in a horizontal direction, the source region being doped with a first conductivity type impurity; and a drain region and a drain line at an other end of each of the plurality of semiconductor patterns in the horizontal direction, and the drain region being doped with a second conductivity type impurity, the second conductivity type impurity being opposite the first conductivity type impurity.

2. The semiconductor memory device of claim 1, wherein a material of the plurality of charge trap layers has a higher trap site density and a higher permittivity compared to a material of the gate insulation layer.

3. The semiconductor memory device of claim 2, wherein the plurality of charge trap layers include at least one of silicon nitride (SiN), aluminum oxide (AlO), hafnium oxide (HfO), and a yttrium oxide (YO).

4. The semiconductor memory device of claim 1, wherein the plurality of semiconductor patterns are configured operate as a channel region, and the plurality of semiconductor patterns include at least one of doped silicon, polysilicon, silicon germanium, a 2D material semiconductor, amorphous metallic oxide, and polycrystal metallic oxide.

5. The semiconductor memory device of claim 1, wherein a diameter of the horizontal cross-section of at least one of the plurality of semiconductor patterns is greater than a diameter of the horizontal cross-section of at least one of the plurality of charge trap layers.

6. The semiconductor memory device of claim 1, wherein the source region includes a high concentration of an n type impurity to provide an n+ region, and the drain region includes a high concentration of a p type impurity to provide a p+ region.

7. The semiconductor memory device of claim 1, further comprising:

a plurality of insulation layers and a plurality of conductive layers alternately stacked on the semiconductor substrate, wherein each of the plurality of conductive layers includes the source line and the drain line.

8. The semiconductor memory device of claim 7, wherein in each of the plurality of conductive layers, the source line and the drain line are parallel to each other.

9. The semiconductor memory device of claim 1, wherein the semiconductor memory device is capacitorless dynamic random access memory (DRAM).

10. The semiconductor memory device of claim 1, further comprising:

a peripheral circuit structure between the semiconductor substrate and the gate structure.

11. A semiconductor memory device comprising:

a semiconductor substrate;

a gate structure extending in a vertical direction on the semiconductor substrate, the gate structure including a gate insulation layer and a gate electrode layer;

a plurality of charge trap layers each having a horizontal cross-section with a first ring shape surrounding the gate structure, and the plurality of charge trap layers being spaced apart from each other in the vertical direction;

a plurality of semiconductor patterns each having a horizontal cross-section with a second ring shape surrounding the plurality of charge trap layers, and the plurality of semiconductor patterns being spaced apart from each other in the vertical direction;

a source line extending in the vertical direction on the semiconductor substrate;

a source region between one end of each of the plurality of semiconductor patterns and the source line, the source region being doped with a first conductivity type impurity; and a drain region and a drain line at an other end of each of the plurality of semiconductor patterns in a horizontal direction, the drain region being doped with a second conductivity type impurity, and the second conductivity type impurity being opposite the first conductivity type impurity.

12. The semiconductor memory device of claim 11, wherein a material of the plurality of charge trap layers includes has a higher trap site density and a higher permittivity compared to a material of the gate insulation layer, the plurality of charge trap layers include a charge trap layer, and the charge trap layer includes at least one of silicon nitride (SiN), aluminum oxide (AlO), hafnium oxide (HfO), and yttrium oxide (YO).

13. The semiconductor memory device of claim 11, wherein a diameter of the horizontal cross-section of at least one of the plurality of semiconductor patterns is greater than a diameter of the horizontal cross-section of at least one of the plurality of charge trap layers.

14. The semiconductor memory device of claim 11, wherein the source region includes a high concentration of an n type impurity to provide an n+ region, and the drain region includes a high concentration of a p type impurity to provide a p+ region.

15. The semiconductor memory device of claim 11, further comprising:

a plurality of insulation layers and a plurality of conductive layers alternately stacked on the semiconductor substrate, wherein each of the plurality of conductive layers includes the drain line.

16. The semiconductor memory device of claim 15, wherein each of the plurality of conductive layers includes the source line, and in each of the plurality of conductive layers, the drain line and the source line are perpendicular to each other.

17. The semiconductor memory device of claim 16, further comprising:

an etch stop layer at a lowermost bottom of the plurality of insulation layers.

18. The semiconductor memory device of claim 11, wherein the semiconductor memory device is capacitorless dynamic random access memory (DRAM).

19. A capacitorless semiconductor memory device comprising:

a semiconductor substrate;

an etch stop layer on the semiconductor substrate;

a plurality of mold insulation layers and a plurality of sacrificial insulation layers alternately stacked on the etch stop layer;

a gate structure having a horizontal cross-section with a circle shape, the gate structure extending into the etch stop layer by penetrating the plurality of mold insulation layers and the plurality of sacrificial insulation layers in a vertical direction, the gate structure including a gate insulation layer and a gate electrode layer;
a plurality of charge trap layers each having a horizontal cross-section with a first ring shape surrounding the gate structure, the plurality of charge trap layers being spaced apart from each other in the vertical direction;
a plurality of channel regions each having a horizontal cross-section with a second ring shape surrounding the plurality of charge trap layers, the plurality of channel regions being spaced apart from each other in the vertical direction;
a source region at one end of each of the plurality of channel regions and a source line electrically connected to the source region, the source region being doped with a first conductivity type impurity; and
a drain region at an other end of each of the plurality of channel regions and a drain line electrically connected to the drain region,
the drain region being doped with a second conductivity type impurity,
the second conductivity type impurity being opposite the first conductivity type impurity.

20. The capacitorless semiconductor memory device of claim 19, wherein
a material of the plurality of charge trap layers has a higher trap site density and a higher permittivity compared to a material of the gate insulation layer,
the plurality of channel regions include an intrinsic semiconductor material, and
the source region includes a high concentration an n type impurity to provide an n+ region, and
the drain region includes a high concentration of a p type impurity to provide a p+ region.

* * * * *